United States Patent [19]

Iwamatsu

[11] Patent Number: 5,920,595
[45] Date of Patent: *Jul. 6, 1999

[54] INTER-CROSS WAVE COMPENSATION METHOD AND APPARATUS PERFORMING FREQUENCY CONVERSION ON SIGNED NOT DETECTED BY A DEMODULATING UNIT

[75] Inventor: Takanori Iwamatsu, Kawasaki, Japan

[73] Assignee: Fujitsu Limited, Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/607,093

[22] Filed: Feb. 28, 1996

[30] Foreign Application Priority Data

Aug. 2, 1995 [JP] Japan .................................. 7-197830

[51] Int. Cl.$^6$ .............................. H03H 7/40; H03D 3/24
[52] U.S. Cl. .......................................... 375/235; 375/376
[58] Field of Search ...................................... 375/235, 232, 375/230, 229, 376, 373; 364/724.2, 724.19; 333/18 R, 28 T

[56] References Cited

U.S. PATENT DOCUMENTS 5,557,646  9/1996  Honma ..................................... 375/346
5,648,988  7/1997  Iwamatsu et al. ....................... 375/232

*Primary Examiner*—Chi H. Pham
*Assistant Examiner*—William Luther
*Attorney, Agent, or Firm*—Helfgott & Karas, P.C.

[57] ABSTRACT

A method and apparatus for inter-cross wave compensation. There are provided a frequency conversion unit for performing frequency conversion for one of two received polarized wave signals, an analog/digital converter for converting the one of the polarized wave signals into a digital signal, a digital orthogonal detection unit for obtaining two orthogonal detection signals, and a digital equalizing unit for performing an equalizing process for outputs of the orthogonal detection unit. Further provided are a digital inter-cross wave compensating unit for receiving the other of the two received polarized wave signals as a digital signal and for outputting a signal used for compensating the output of the equalizing unit, and an adding unit for adding the output of the equalizing unit and the output of the digital inter-cross wave compensating unit. This structure allows a digital demodulation method to be applied to the inter-cross wave compensation, thereby making it possible to form the inter-cross wave compensating apparatus as an LSI and reducing the size and cost of the apparatus. In addition, inter-cross wave compensation can be easily performed even for polarized wave signals which are transmitted without synchronization during modulation for transmission.

21 Claims, 26 Drawing Sheets

INTER-CROSS WAVE COMPENSATION METHOD AND APPARATUS PERFORMING FREQUENCY CONVERSION ON SIGNED NOT DETECTED BY A DEMODULATING UNIT

BACKGROUND OF THE INVENTION

1) Field of the Invention

The present invention relates to a method and apparatus for compensation between cross-polarized waves (hereinafter referred to as "inter-cross wave compensation"), and more particularly to a method and apparatus for inter-cross wave compensation suitable for use in digital radio transmission systems such as those used for digital multiplex radio communication.

2) Description of the Related Art

In radio transmission systems using microwaves, or quasi-millimeter waves, a technique of using both cross-polarized waves is generally used in which signals are transmitted using two polarized waves (a vertical (V) wave and a horizontal (H) wave) having the same frequency and respectively propagating along polarization planes intersecting each other perpendicularly. Such a cross-polarization technique is used because it becomes possible to more efficiently use such frequencies compared to the case where a single polarized wave is used for transmission.

FIG. 23 shows an example of the structures of the transmitting side and the receiving side of a general radio transmission system utilizing cross-polarized waves. In FIG. 23, numeral 100 denotes the transmitting side while numeral 200 denotes the receiving side. The transmitting side 100 comprises modulating units (MOD) 101A and 101B for V and H waves respectively, transmitting units (TX) 102A and 102B, a hybrid (H) 103 for mixing the V and H waves, and a transmitting antenna 104. The receiving side 200 comprises a receiving antenna 201, a hybrid (H) 202 for splitting received polarized signals into a V wave signal and an H wave signal, receiving units (RX) 203A and 203B for V and H waves respectively, and demodulating units (DEM) 204A and 204B.

In the transmitting side 100, data (DATA) undergo a predetermined modulation such as QAM (Quadrature Amplitude Modulation) by the modulating unit (MOD) 101A and the transmitting unit (TX) 102A, so that a V wave is obtained. Another set of data undergo a predetermined modulation by the modulating unit (MOD) 101B and the transmitting unit (TX) 102B, so that an H wave is obtained, having the same frequency as that of the V wave and intersecting the V wave. These V and H waves are mixed by the hybrid (H) 103 and are transmitted through the transmitting antenna 104. In the receiving side 200, modulated transmission signals transmitted from the transmitting side 100 are received by the receiving antenna 201 and are split into a V wave and an H wave by the hybrid 202. These waves are demodulated by the demodulating units 204A and 204B so as to reproduce the original data.

Generally, demodulation at the demodulating unit 204A (204B) of the receiving side 200 is performed by an analog demodulation method or a digital demodulation method. In the analog demodulation method, the modulated transmission signal, which is an analog signal, is detected to carry out demodulation of the signal. In the digital demodulation method, a digital signal contained in the modulated transmission signal is detected by an A/D (analog/digital) converter to carry out demodulation of the signal.

FIG. 24 is a block diagram showing an example of the structure of a demodulating unit 204A (204B) employing an analog demodulation method. The demodulating unit 204A (204B) shown in FIG. 24 comprises a mixer (MIX) 205, roll-off filters 206A and 206B, a transversal (TRV) equalizer 208, a control unit (CONT) 209, low pass filters 210 and 212, a voltage controlled oscillator (CLK VCO) 211 for supplying clocks (CLK) for the A/D converters 207A and 207B, and a local oscillator (LO VCO) 213 for the mixer 205.

A modulated transmission signal within an RF (radio frequency) band received by the receiving antenna 201 is subjected to frequency conversion by the receiving unit 203A (203B) to obtain an IF (intermediate frequency) signal. The reception IF signal is orthogonally detected using a carrier wave regeneration signal from the local oscillator 213, so that the frequency of the reception IF signal is converted (down conversion) so as to obtain two base band signals I and Q having a phase difference of 90° therebetween. In practice, the reception IF signal is split into two waves by the hybrid 214. The split waves are multiplied (mixed) by multipliers 215 and 216 using signals from a hybrid 217, which splits the signal from the local oscillator 213 into two waves, so that the base band signals I and Q are obtained.

The roll-off filters 206A and 206B remove noise components and the like included in the base band signals I and Q, which have been obtained in the above-described manner. The A/D converters 207A and 207B convert the base band signals (analog signals) into corresponding digital signals I and Q in accordance with the timing of A/D conversion clocks supplied from the voltage controlled oscillator 210. In some cases, the roll-off filters 206A and 206B may be disposed on the output side of the demodulating unit 204A (204B) or in a stage succeeding the A/D converters 207A and 207B.

As is well known, the transversal equalizer 208 delays the digital signals I and Q to adaptively infer from the past data a distortion component (distortion produced by a transmission line) contained in present data, and controls an internal tap coefficient based on the inferred distortion component. With this operation, the distortion component is removed to equalize the signals.

The control unit 209 detects from the output of the transversal equalizer 208 information such as a shift of clock phase and a frequency error, and performs feedback control for the voltage controlled oscillator 211 and the local oscillator 213 based on the detected information. With this operation, frequency conversion and A/D conversion can be performed at an optimal clock phase and frequency. In other words, the demodulating unit 204A (204B) shown in FIG. 24 employs a so-called homodyne detection method.

The low pass filters 210 and 212 integrate information (digital values) such as a phase shift and a frequency error obtained by the control unit 209 so as to convert the information into voltage values. The voltage values are supplied to the voltage controlled oscillator 211 and to the local oscillator 213 as control voltages.

In the above-described demodulating unit 204A (204B), due to the above structure, the reception IF signal is subjected to orthogonal detection (homodyne detection) by the mixer 205 in accordance with the carrier wave regeneration signal from the local oscillator 213, so that the IF signal is converted to a lower frequency so as to obtain base band signals I and Q. The noise components and the like of the base band signals I and Q are removed by the roll-off filters 206A and 206B.

The base band signals I and Q are converted (A/D conversion) into the digital signals I and Q with an optimal phase by the A/D converters 207A and 207B in accordance with A/D conversion clocks from the voltage controlled oscillator 211, which is feedback-controlled by the control unit 209. The digital signals I and Q undergo an equalizing process performed by the transversal equalizer 208, so that the digital signals I and Q are outputted as reception data of the V wave (H wave).

FIG. 25 is a block diagram showing an example of the structure of a demodulating unit 204A (204B) employing an digital demodulation method. The demodulating unit 204A (204B) shown in FIG. 25 comprises a-down (DOWN) converter 221, an A/D converter 222, a digital orthogonal detection unit 223, roll-off filters 224A and 224B, a transversal (TRV) equalizer 225, a control unit (CONT) 226, low pass filters 227 and 228, a voltage controlled oscillator (CLK VCO) 229 for supplying clocks (CLK) for the A/D converter 222, and a local oscillator (LO VCO) 230 for the down converter 221.

The down converter 221 performs frequency conversion (down conversion) using the carrier wave regeneration signal received from the local oscillator 230 for the RF signal received by the receiving antenna 201 so as to obtain an IF (intermediate frequency) signal. Generally, the down converter 221 comprises a single mixer (multiplier). The A/D converter 222 converts the reception IF signal into a digital signal in accordance with timing clocks for A/D conversion supplied from the voltage controlled oscillator 229.

The digital orthogonal detection unit 223 performs orthogonal detection for the digital signal obtained by the A/D converter 222 using trigonometric function signals representing a sine (sin) wave and a cosine (cos) wave. As a result, frequency conversion is performed, and two digital signals I and Q in the base band range having a phase difference of 90° therebetween are obtained. The roll-off filters 224A and 224B remove noise components and the like from the base band signals I and Q which have been obtained in the above-described manner.

The transversal equalizer 225, the control unit 226, the low pass filters 227 and 228, the voltage controlled oscillator 229, and the local oscillator 230 are identical to the transversal equalizer 208, the control unit 209, the low pass filters 210 and 212, the voltage controlled oscillator 211, and the local oscillator 213, respectively, which have been described with reference to FIG. 24. The homodyne detection method is also employed in the demodulating unit 204A (204B) using the digital demodulation method.

In the demodulating unit 204A (204B) employing the digital demodulation method, due to the above-described structure, a modulated wave (reception IF signal) which has been modulated by the modulating unit 101A (101B) of the transmitting side 100 using a carrier wave signal having a center frequency $f_{LO}$, for example, is subjected to down conversion by the down converter 221, As a result, the modulated wave (reception IF signal) is converted (down conversion) such that it has a clock frequency (center frequency: $f_{CLK}$) at which A/D conversion by the A/D converter 222 can be performed.

The reception IF signal is converted (A/D conversion) into a digital signal at an optimal phase by the A/D converter 222 in accordance with timing clocks for A/D conversion from the voltage controlled oscillator 229, which is feedback-controlled by the control unit 226. The digital signal is orthogonally detected by the digital orthogonal detection unit 223 to obtain digital signals I and Q of the base band having a phase difference of 90° therebetween Specifically, in the digital orthogonal detection unit 223, the digital signals I and Q are obtained by the following equations:

$$I = IF_{IN} \times \cos\theta$$

$$Q = IF_{IN} \times \sin\theta$$

wherein $IF_{IN}$ is the digital signal from the A/D converter 222 and θ is a clock phase, and wherein θ is varied over one cycle at the clock speed of the voltage controlled oscillator 229.

For example, assuming that the conversion rate of the A/D converter 222 is four times the clock speed, θ is repeatedly changed as follows:

$$0° \rightarrow 90° \rightarrow 180° \rightarrow 270° \rightarrow 0° \rightarrow 90° \rightarrow$$

Accordingly, the digital demodulated signals I and Q vary such that $I=IF_{IN}$ and Q=0 when θ=0°, I=0 and $Q=IF_{IN}$ when θ=90°, $I=-IF_{IN}$ and Q=0 when θ=180°, and I=0 and $Q=-IF_{IN}$ when θ=270°.

After that, the noise components and the like of the digital signals I and Q are removed by the roll-off filters 224A and 224B. The digital signals I and Q are then subjected to equalization by the transversal equalizer 225 and are outputted as reception data of the V wave (H wave).

As described above, in the demodulating unit 204A (204B) utilizing the digital demodulation method, the process by the A/D converter 222 and the following processes are all performed in digital form. Accordingly, the bulk of the demodulating unit 204A (204B) can be formed by digital circuits.

In the radio transmission system utilizing the technique of using both cross-polarized waves which has been described with reference to FIG. 23, it is required to provide good separation between two polarized waves, i.e., V and H waves (XPD: Cross Polarization Discrimination).

However, a signal including only a V wave (H wave) is interfered by an H wave (V wave) in a transmission pass such as a space, resulting in deterioration of XPD, Such an interference occurs, for example, due to multipath fading in the microwave band, and inclination of rain drops in the quasi-millimeter wave or higher wave band. Therefore, it is general practice to exchange V and H waves between the demodulating units 204A and 204B, as shown in FIG. 23, so as to perform compensation for interference between the polarized waves (inter-cross wave interference compensation), thereby compensating the deterioration of XPD.

FIG. 26 is a block diagram showing an example of the structure of a demodulating unit of an analog demodulation type which is used when the inter-cross wave interference compensation is performed. In FIG. 26, units and components identical to those shown in FIG. 24 are denoted by the same reference numerals. In the demodulating unit 204A (204B) shown in FIG. 26, analog V wave (H wave) signals (base band signals I and Q), before undergoing A/D conversion by the A/D converter 207A and 207B, are outputted to the demodulating unit 204B (204A) for the other polarized wave, i.e., the H wave (V wave), as a signal for the inter-cross polarized wave interference compensation. The demodulating unit 204A (204B) receives the H wave (V wave) signal from the demodulating unit 204B (204A) for the H wave (V wave), as a signal for the inter-cross polarized wave interference compensation.

In the demodulating unit 204A (204B), H wave (V wave) signals are subjected to A/D conversion by A/D converters 231A and 231B so as to obtain digital H wave (V wave) signals. Thus obtained digital signals are supplied to an inter-cross wave interference compensating unit (XPIC) 232, which detects H wave (V wave) signals mixed into the V wave (H wave) signals as an interference component.

The inter-cross wave interference compensating unit 232 outputs compensation signals for compensating the inter-cross wave interference to adders 234 and 235 of an adding unit 233. The compensation signals and the outputs of the transversal equalizer 208 are added together by the addition unit 233 to compensate the inter-cross wave interference.

The inter-cross wave interference compensating unit 232 generally comprises an FIR filter which is one kind of the transversal equalizer 208 and generates compensation signals by varying the internal tap coefficient in accordance with the magnitude of the inter-cross wave interference.

However, in the demodulating unit 204A (204B) of the analog demodulation type capable of compensating inter-cross wave interference, which has been described with reference to FIG. 26, only limited portions such as the transversal equalizer 208 and the inter-cross wave interference compensating unit 232 can be digital circuits. This is very unfavorable to efforts in reducing the size of the circuits and costs.

Further, to perform the above-described inter-cross wave interference compensation, wave signals for compensation which are exchanged between the demodulating units 204A and 204B must be synchronous with interference in the space.

FIG. 27 shows an example of the relationship between frequencies in the case where a so-called co-channel transmission (transmission using V and H waves) is performed in the structure shown in FIG. 23. In FIG. 27, units and components identical to those shown in FIG. 23 are denoted by the same reference numerals. Numerals 105A, 105B, 106A, 106B, 241A, 241B, 242A and 242B denote voltage controlled local oscillators In the transmitting side 100, the local oscillators 105A and 105B supply the modulating units (MOD) 101A and 101B with carrier wave signals (center frequency: $f_{V1}$, $f_{H1}$) which are used for frequency conversion (up conversion, see functions (21) and (26) in FIG. 27) of transmission data (V and H waves) of the base band range into IF signals. The local oscillators 106A and 106B supply the transmitting units (TX) 102A and 102B with carrier wave signals which are used for up conversion (see functions (22) and (27)) of the IF signals from the modulating units 101A and 101B into RF signals.

In the receiving side 200, the local oscillators 241A and 241B supply the receiving units (RX) 203A and 203B with carrier wave regeneration signals (center frequency: $f_{V3}$, $f_{H3}$) which are used for frequency conversion (down conversion, see functions (24) and (29)) of reception signals (V and H waves, see functions (23) and (28)) received by the receiving antenna 201 into IF signals. The local oscillators 242A and 242B supply the demodulating units 204A and 204B with carrier wave regeneration signals (center frequency: $f_{V4}$, $f_{H4}$) which are used for down conversion (see functions (25) and (30)) of the IF signals from the receiving units 203A and 203B into base band signals.

In other words, the local oscillators 242A and 242B correspond to the local oscillators (LO VCO) 213 or 230 of the demodulating unit 204A (204B) shown in FIG. 24 or 25.

For the sake of convenience, it is assumed that interference occurs in one direction from H waves to V waves. A coefficient representing the degree of interference is represented by α, and the functions representing modulated waves are represented by V () and H ().

From the functions (25) and (30) in FIG. 27, it is understood that the following equations must be satisfied to perform inter-cross wave interference compensation:

$$H(f_{H1}+f_{H2}-f_{V3}-f_{V4})=H(f_{H1}+f_{H2}-f_{H3}-f_{H4})$$

i.e., $$f_{V3}+f_{V4}=f_{H3}+f_{H4} \tag{1}$$

Since the carrier waves are synchronized between the transmitting side 100 and the receiving side 200, the following equations are given:

$$f_{V1}+f_{V2}-f_{V3}-f_{V4}=0 \tag{2}$$

$$f_{H1}+f_{H2}-f_{H3}-f_{H4}=0 \tag{3}$$

From equation (2), the following equation can be obtained.

$$f_{V1}+f_{V2}=f_{V3}+f_{V4} \tag{4}$$

From equation (3), the following equation can be obtained.

$$f_{H1}+f_{H2}=f_{H3}+f_{H4} \tag{5}$$

Substitution of equations (4) and (5) into equation (1) gives the following equation.

$$f_{V1}+f_{V2}=f_{H1}+f_{H2} \tag{6}$$

Accordingly, the above-described synchronization of carrier waves can be performed by adjusting the local oscillators 105A, 105B, 106A and 106B in the transmitting side 100.

However, the synchronization of carrier waves by local oscillators 105A, 105B, 106A and 106B considerably increases costs. In addition, this is unfavorable in terms of maintenance such as fine adjustment performed when synchronization is lost.

SUMMARY OF THE INVENTION

The present invention has been accomplished in view of the above-mentioned problems. A first object of the present invention is to provide a method and apparatus for inter-cross wave compensation in which a digital demodulation method is applied to a demodulating unit which carries out inter-cross wave interference compensation, thereby allowing the demodulating unit to be manufactured as an LSI so as to reduce the size and costs of the demodulating unit.

A second object of the present invention is to provide a method and apparatus for inter-cross wave compensation in which compensation for inter-cross wave interference can be easily carried out without performing synchronization during modulation for transmission at the transmitting side.

To accomplish the above-mentioned objectives, the present invention provides an improved method for inter-cross wave compensation. The method comprises the steps of:

performing frequency conversion for one of two received polarized wave signals intersecting each other, converting the one of the two signals into a digital signal by an analog/digital converter, and detecting the digital signal by a digital demodulating unit; and supplying a digital inter-cross wave compensating unit with a signal obtained by performing frequency conversion for the other of the two received polarized wave signals intersecting each other but not detected by the digital demodulating unit, and compensating the output of the digital demodulating unit for the one of the polarized wave signals in accordance with the output of the inter-cross wave compensating unit.

The present invention also provides an improved apparatus for inter-cross wave compensation. The apparatus comprises:

a frequency conversion unit for performing frequency conversion for one of two received polarized wave signals intersecting each other;

an analog/digital converter for converting the one of the polarized wave signals, which has undergone frequency conversion by the frequency conversion unite into a digital signal;

a digital orthogonal detection unit for detecting the one of the polarized wave signals which has been converted into a digital signal by the analog/digital converter, to obtain two orthogonal detection signals;

a digital equalizing unit for performing an equalizing process for the outputs of the orthogonal detection unit;

a digital inter-cross wave compensating unit for receiving, as a digital signal, a signal which is obtained through frequency conversion for the other of the two received polarized wave signals intersecting each other but which has not been detected by the digital orthogonal detection unit, and for outputting a signal used for compensating the output of the digital equalizing unit; and an adding unit for adding the output of the digital equalizing unit and the output of the digital inter-cross wave compensating unit together.

Accordingly, in the method and apparatus for inter-cross wave compensation, process by the analog/digital converter and the following processes can be performed in digital. This makes it possible to perform compensation between cross-polarized waves with considerably high accuracy.

Further, in the method for inter-cross wave compensation according to the present invention, frequency conversion and detection are performed for one of two received polarized wave signals which are transmitted without synchronization during modulation for transmission and which intersect each other; and phase rotation is performed for a signal obtained by frequency conversion of the other of the two received polarized wave signals intersecting each other, thereby performing frequency correction, the compensated signal is supplied to the inter-cross wave compensating unit, and the output of the digital demodulating unit for the one of the polarized wave signals is compensated in accordance with the output of the inter-cross wave compensating unit.

Also, the apparatus for inter-cross wave compensation according to the present invention comprises:

an analog orthogonal detection unit for performing frequency conversion for one of two received polarized wave signals which are transmitted without synchronization during modulation for transmission and which intersect each other, and for detecting the one of the received polarized wave signals so as to obtain two orthogonal detection signals;

a first analog/digital converter for respectively converting the two orthogonal detection signals obtained by the orthogonal detection unit into digital signals;

a digital equalizing unit for performing an equalizing process for the two orthogonal detection signals which have been converted into digital signals by the first analog/digital converter;

a second analog/digital converter for performing conversion into digital signals for signals which have been obtained by detecting, as the two orthogonal detection signals, the other of the two received polarized wave signal intersecting each other by the analog orthogonal detection unit but which have not been converted into digital signals by the first analog/digital converter, operational clocks of the second analog/digital converter being synchronized with those for the first analog/digital converter;

a phase rotating unit for carrying out phase rotation for output from the second analog/digital converter so as to perform frequency correction; and a digital inter-cross wave compensating unit for receiving the output of the phase rotating unit so as to compensate the output of the digital equalizing unit;

an adding unit for adding the output of the digital equalizing unit and the output of the digital inter-cross wave compensating unit together; and a control unit for controlling the phase rotating unit based on information regarding the input of the digital inter-cross wave compensating unit and information regarding the output of the adding unit.

Accordingly, in the method and apparatus for inter-cross wave compensation, inter-cross wave compensation can be extremely easily performed even for polarized wave signals which are transmitted without performing synchronization during modulation for transmission at the transmitting side. This greatly contributes to decreasing the costs of inter-cross wave interference compensation. In addition, since two polarized wave signals are not synchronized at the transmitting side, fine adjustment of frequencies for synchronization of the two polarized wave signals can be extremely easily performed.

Moreover, the apparatus for inter-cross wave compensation according to the present invention comprises:

a frequency conversion unit for performing frequency conversion for one of two received polarized wave signals which are transmitted without synchronization during modulation for transmission and which intersect each other;

an analog/digital converter for converting the one of the polarized wave signals, which has undergone frequency conversion by the frequency conversion unit, into a digital signal;

a digital orthogonal detection unit for detecting the one of the polarized wave signals, which has been converted into a digital signal by the analog/digital converter, to obtain two orthogonal detection signals;

a digital equalizing unit for performing an equalizing process for the outputs of the orthogonal detection unit;

a phase rotating unit for receiving, as a digital signal, a signal which is obtained by performing frequency conversion for the other of the two received polarized wave signals intersecting each other but which has not been detected by the digital orthogonal detection unit, and for performing phase rotation for the digital signal so as to perform frequency correction;

a digital inter-cross wave compensating unit for receiving an output from the phase rotating unit so as to compensate the output of the digital equalizing unit;

an adding unit for adding the output of the digital equalizing unit and the output of the digital inter-cross wave compensating unit together; and a control unit for controlling the phase rotating unit based on information regarding the input of the digital inter-cross wave compensating unit and information regarding the output of the adding unit.

In this apparatus for inter-cross wave compensation of the present invention, a digital orthogonal detection unit is used instead of the above-described analog orthogonal detection unit. Accordingly, inter-cross wave compensation can be performed more accurately even for polarized signals which are transmitted without synchronization during modulation for transmission at the transmitting side.

DESCRIPTION OF THE PREFERRED EMBODIMENTS (a) Aspects of the Present Invention

First, aspects of the present invention will be described with reference to the drawings.

Figure 1:
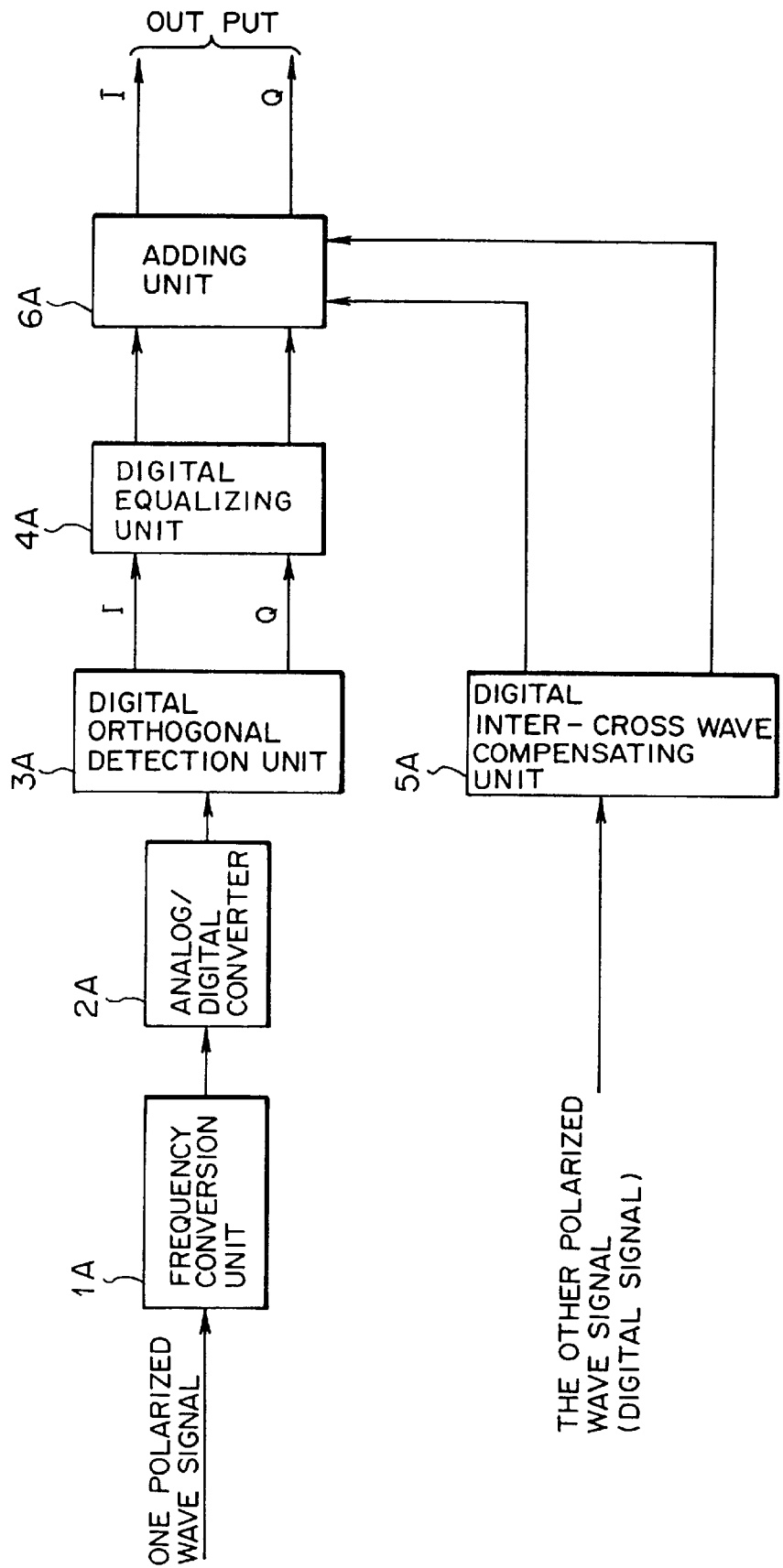
FIG. 1 is a block diagram showing a first aspect of the present invention.

FIG. 1 is a block diagram showing a first aspect of the present invention. In FIG. 1, numeral 1A denotes a frequency conversion unit, numeral 2A denotes an analog/digital converter, numeral 3A denotes a digital orthogonal detection unit, numeral 4A denotes a digital equalizing unit, numeral 5A denotes a digital inter-cross wave compensating unit, and numeral 6A denotes an adding unit.

The frequency conversion unit 1A performs frequency conversion for one of two received polarized wave signals intersecting each other. The analog/digital converter 2A converts the one of the polarized wave signals, which has undergone frequency conversion by the frequency conversion unit 1A, into a digital signal. The digital orthogonal detection unit 3A detects the one of the polarized wave signals, which has been converted into a digital signal by the analog/digital converter 2A, to obtain two orthogonal detection signals I and Q.

The digital equalizing unit 4A performs an equalizing process for the outputs of the orthogonal detection unit 3A. The digital inter-cross wave compensating unit 5A receives, as a digital signal, a signal which is obtained by performing frequency conversion for the other of the two received polarized wave signals intersecting each other but which has not been detected by the digital orthogonal detection unit 3A, and outputs a signal used for compensating the output of the digital equalizing unit 4A. The adding unit 6A adds the output of the digital equalizing unit 4A and the output of the digital inter-cross wave compensating unit 5A together.

With this structure, after frequency conversion is performed for one of the two received polarized wave signals intersecting each other, the one of the two signals is converted into a digital signal by the analog/digital converter 2A, and the digital signal is detected by the digital demodulating unit (digital orthogonal detection unit) 3A. Further, the digital inter-cross wave compensating unit 5A is supplied with a signal obtained by performing frequency conversion for the other of the two received polarized wave signals intersecting each other but not detected by the digital demodulating unit, and the output of the digital demodulating unit for the one of the polarized wave signals is compensated in accordance with the output of the inter-cross wave compensating unit 5A.

Accordingly, in the method and apparatus for inter-cross wave compensation according to the present invention, process by the analog/digital converter 2A and the following processes can be performed in digital This makes it possible to perform inter-cross wave compensation with considerably high accuracy.

Further, an analog signal after frequency conversion of the other of the polarized wave signals may be used as a signal inputted to the inter-cross wave compensating unit 5A. Also, a digital signal which is obtained by frequency conversion of the other of the polarized wave signals and is then converted into a digital signal by an analog/digital converter may be used.

When an analog signal after frequency conversion of the other of the polarized wave signals is used as a signal inputted to the inter-cross wave compensating unit 5A, inter-cross wave compensation can be easily realized. When a digital signal after frequency converting the other of the polarized wave signals and then converting the frequency-converted signal into a digital signal by an analog/digital converter is used, the digital signal can be used as is in the inter-cross wave compensating unit 5A. Accordingly, inter-cross wave compensation can be realized by a simplified structure.

Also, in the case where an analog signal after frequency conversion of the other of the polarized wave signals is used as a signal inputted to the inter-cross wave compensating unit 5A, as described above, an analog/digital converter may be provided in a stage preceding to the digital inter-cross wave compensating unit 5A so as to convert the one of the polarized wave signals, which has undergone frequency conversion by the frequency conversion unit 1A, into a digital signal, wherein operational clocks of the analog/digital converter are synchronized with operational clocks of the analog/digital converter 2A. In this case, since the signal inputted to the inter-cross wave compensating unit 5A can be converted into a digital signal, an apparatus using the above-described inter-cross wave compensation can be extremely easily obtained.

In the case where a digital signal which is obtained by frequency conversion of the other of the polarized wave signals and is further converted into a digital signal by an analog/digital converter is used, a memory may be provided in a stage preceding the digital inter-cross wave compensating unit 5A so as to eliminate uncertainty of the clock phase between the polarized waves. In this case, a signal having an improved accuracy can be inputted to the inter-cross wave compensating unit 5A. Accordingly, it is possible to carry out inter-cross wave compensation with improved accuracy.

Since each of the digital orthogonal detection unit 3A, the digital equalizing unit 3B, the digital inter-cross wave compensating unit 6B, and the adding unit 7B receives a digital signal as an input thereto, these units can be fabricated as LSIs. This greatly contributes to decreasing the size and costs of the inter-cross wave compensating apparatus.

Figure 2:
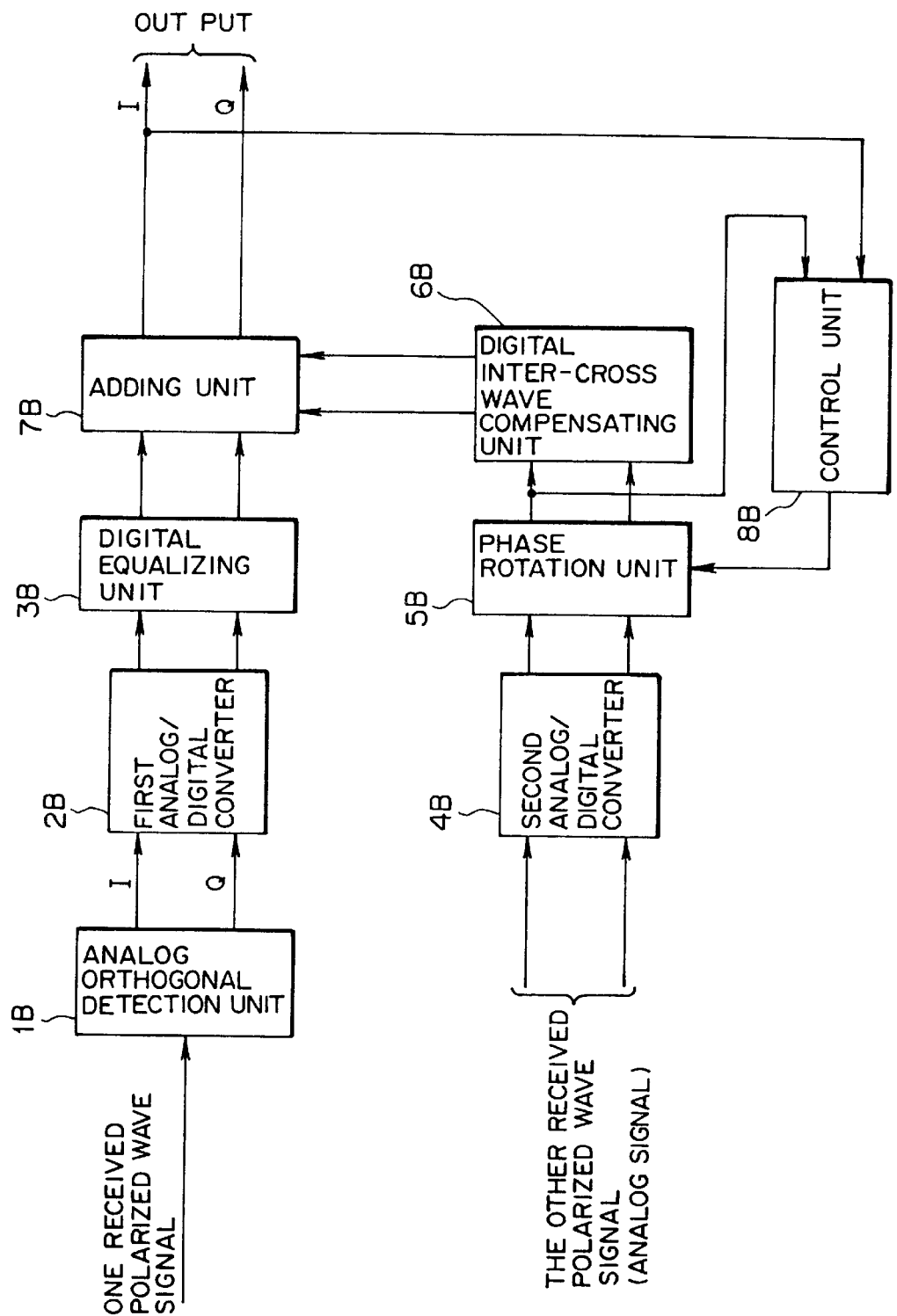
FIG. 2 is a block diagram showing a second aspect of the present invention.

FIG. 2 is a block diagram showing a second aspect of the present invention. In FIG. 2, numeral 1B denotes an analog orthogonal detection unit, numeral 2B denotes a first analog/digital converter, numeral 3B denotes a digital equalizing unit, numeral 4B denotes a second analog/digital converter, numeral 5B denotes a phase rotating unit, numeral 6B denotes a digital inter-cross wave compensating unit, numeral 7B denotes an adding unit, and numeral 8B denotes a control unit.

The analog orthogonal detection unit 1B performs frequency conversion for one of two received polarized wave signals which are transmitted without synchronization during modulation for transmission and which intersect each other, and detects the one of the received polarized wave signals so as to obtain two orthogonal detection signals I and Q. The first analog/digital converter 2B converts the two orthogonal detection signals I and Q obtained by the orthogonal detection unit 1B into digital signals. The digital equalizing unit 3B performs an equalizing process for the two orthogonal detection signals I and Q which have been converted into digital signals by the first analog/digital converter 2B.

The second analog/digital converter 4B performs conversion into digital signals for signals which have been obtained by detecting, as the two orthogonal detection signals I and Q, the other of the two received wave signals intersecting each other by the analog orthogonal detection unit 1B but which have not been converted into digital signals by the first analog/digital converter 2B. Operational clocks of the second analog/digital converter 4B are synchronized with those of the first analog/digital converter 2B.

The phase rotating unit 5B carries out phase rotation for the output of the second analog/digital converter 4B so as to perform frequency correction The digital inter-cross wave compensating unit 6B receives the output of the phase rotating unit 5B so as to compensate the output of the digital equalizing unit 3B. The adding unit 7B adds the output of the digital equalizing unit 3B and the output of the digital inter-cross wave compensating unit 6B together.

The control unit 8B controls the phase rotating unit 5B based on information regarding the input of the digital inter-cross wave compensating unit 6B and information regarding the output of the adding unit 7B.

In this structure of the present invention, one of the two received polarized wave signals which are transmitted without synchronization during modulation for transmission and which intersect each other is subjected to frequency conversion and detection by the orthogonal detection unit 1B, and the signal obtained through frequency conversion of the other of the two received polarized wave signals intersecting each other is subjected to phase rotation by the phase rotating unit 5B so as to perform frequency correction. After that, the compensated signal is supplied to the inter-cross wave compensating unit 6B, and the output of the digital demodulating unit (orthogonal detection unit 1B, the first analog/digital converter 2B, and the digital equalizing unit 3B) can be compensated by using the output of the inter-cross wave compensating unit 6B.

The orthogonal detection unit 1B may be formed as a homodyne detection unit. Also, it is possible to provide a phase rotating unit for carrying out phase rotation for the output from the first analog/digital converter 2B so as to perform frequency correction, whereby a quasi-homodyne detection unit is formed by the phase rotating unit and the orthogonal detection unit 1B.

Accordingly, in the apparatus (method) for inter-cross wave compensation inter-cross wave compensation can be extremely easily performed even for polarized wave signals which are transmitted without performing synchronization during modulation for transmission at the transmitting side. This greatly contributes to decreasing the costs of inter-cross wave interference compensation. In addition, since two polarized wave signals are not synchronized at the transmitting side, fine adjustment of frequencies for synchronization of the two polarized wave signals can be extremely easily performed.

Specifically, the control unit 8B may have a structure such that phase shift information for controlling the phase rotating unit 53 is obtained based on information regarding the polarity of the input of the digital inter-cross wave compensating unit 6B and information regarding an error in the output of the adding unit 7B, and the phase shift information is outputted as a phase rotating unit control signal. Also, the control unit 8B may have a structure such that phase shift information for controlling the phase rotating unit 5B is obtained based on information regarding an exclusive OR operation between the polarity information of the input of the digital inter-cross wave compensating unit 6B and the polarity information of an error in the output of the adding unit 7B, and the phase shift information is outputted as a phase rotating unit control signal.

Accordingly, in the above-described control unit 8B, frequency correction by phase rotation performed by the phase rotating unit 5B can be reliably controlled by a simple structure.

Figure 3:
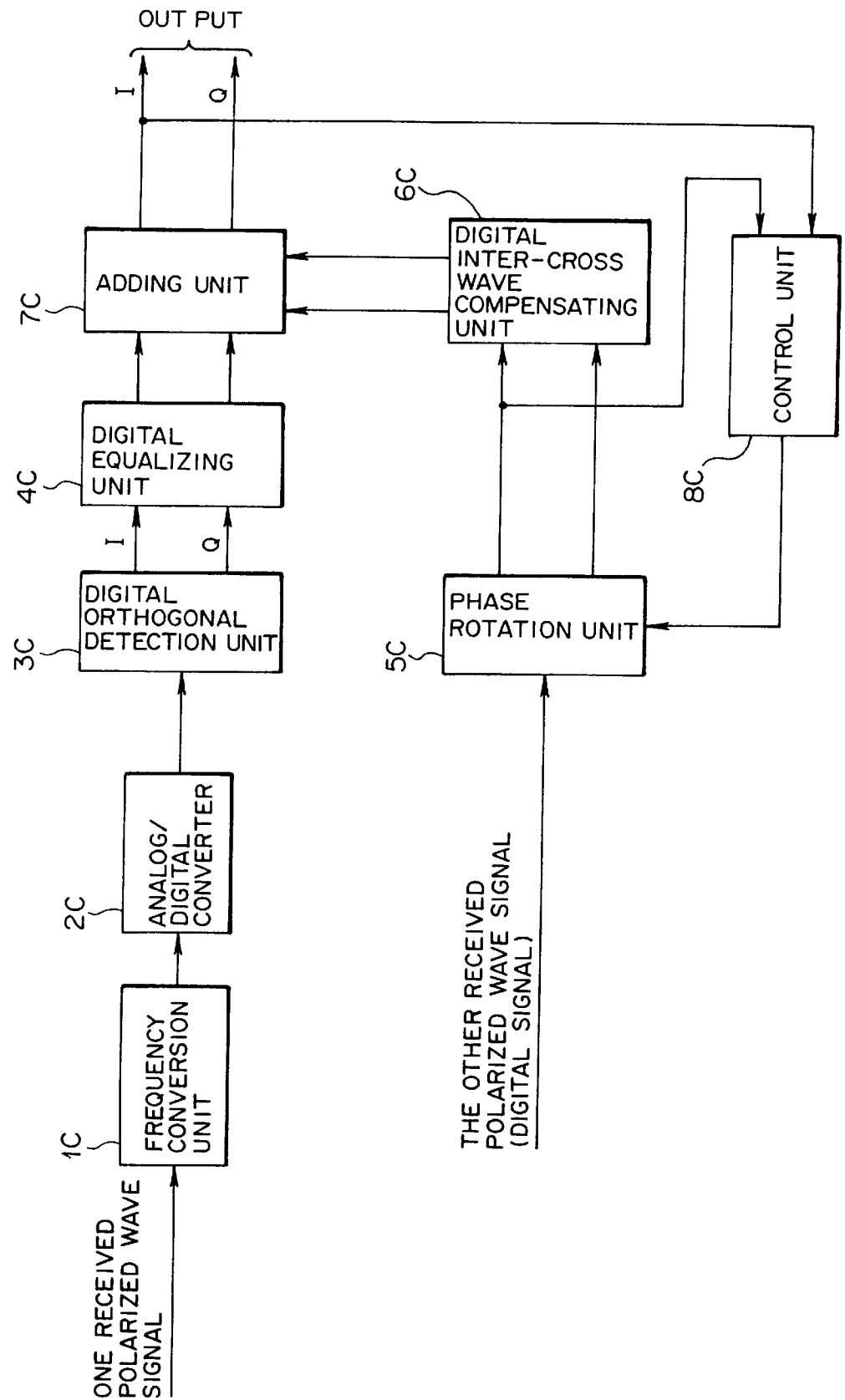
FIG. 3 is a block diagram showing a third aspect of the present invention.

FIG. 3 is a block diagram showing a third aspect of the present invention. In FIG. 3, numeral 1C denotes a frequency conversion unit, numeral 2C denotes an analog/digital converter, numeral 3C denotes a digital orthogonal detection unit, numeral 4C denotes a digital equalizing unit, numeral 5C denotes a phase rotating unit, numeral 6C denotes a digital inter-cross wave compensating unit, numeral 7C denotes an adding unit, and numeral 8C denotes a control unit.

The frequency conversion unit 1C performs frequency conversion for one of the two received polarized wave signals which are transmitted without synchronization during modulation for transmission and which intersect each other. The analog/digital converter 2C converts the one of the polarized wave signals, which has undergone frequency conversion by the frequency conversion unit 1C, into a digital signal. The digital orthogonal detection unit 3C detects the one of the polarized wave signals, which has been converted into a digital signal by the analog/digital converter 2C, to obtain two orthogonal detection signals I and Q.

The digital equalizing unit 4C performs an equalizing process for the outputs of the orthogonal detection unit 3C. The phase rotating unit 5C receives, as a digital signal, a signal which is obtained through frequency conversion for the other of the two received polarized wave signals intersecting each other but which has not been detected by the digital orthogonal detection unit 3C, and performs phase rotation for the digital signal so as to perform frequency correction. The digital inter-cross wave compensating unit 6C receives an output from the phase rotating unit 5C so as to compensate the output of the digital equalizing unit 4C.

The adding unit 7C adds the output of the digital equalizing unit 4C and the output of the digital inter-cross wave compensating unit 6C together. The control unit 8C controls the phase rotating unit 5C based on information regarding the input of the digital inter-cross wave compensating unit 6C and information regarding the output of the adding unit 7C.

In this apparatus (method) for inter-cross wave compensation of the present invention, the digital orthogonal detection unit 3C is used instead of the above-described analog orthogonal detection unit 1B. Accordingly, inter-cross wave compensation can be performed more accurately even for polarized signals which are transmitted without synchronization during modulation for transmission at the transmitting side.

Also, in the case where an analog signal after frequency conversion of the other of the polarized wave signals is used as a signal inputted to the phase rotating unit 5C, an analog/digital converter may be provided in a stage preceding to the phase rotating unit 5C so as to convert the one of the polarized wave signals, which has undergone frequency conversion by the frequency conversion unit 1C, into a digital signal, wherein operational clocks of the analog/digital converter are synchronized with operational clocks of the analog/digital converter 2C. In this case, since the signal inputted to the inter-cross wave compensating unit 6C can be converted into a digital signal, an inter-cross wave compensating apparatus can be extremely easily obtained to which the above-described inter-cross wave compensation method is applied.

In the case where a digital signal which is obtained by frequency conversion of the other of the polarized wave signals and is further converted into a digital signal by an analog/digital converter 2C is used as a signal inputted to the phase rotating unit 5C, a memory may be provided in a stage preceding the phase rotating unit 5C so as to eliminate uncertainty of the clock phase between the polarized waves. In this case, a signal having an improved accuracy can be inputted to the inter-cross wave compensating unit 6C. Accordingly, it is possible to carry out inter-cross wave compensation with improved accuracy.

Since each of the digital orthogonal detection unit 3C, the digital equalizing unit 4C, the phase rotating unit 5C, the digital inter-cross wave compensating unit 6C, and the adding unit 7C inputs a digital signal, all of these units can be fabricated as LSIs. This greatly contributes to decreasing the size and costs of the inter-cross wave compensating apparatus.

In the above-described apparatus, a homodyne detection method may be employed in which the frequency conversion by the frequency conversion unit 1C is performed by using feedback of an output obtained by detection. Further, a quasi-homodyne detection method may be employed in which the frequency conversion by the frequency conversion unit 1C is performed without using feedback of an output obtained by detection, thereby contributing much to flexible circuit design.

The control unit 8C may have a structure such that phase shift information for controlling the phase rotating unit 5C is obtained based on the polarity information of the input of the digital inter-cross wave compensating unit 6C and the error information of the output of the adding unit 7C, and the phase shift information is outputted as a phase rotating unit control signal. Also, the control unit 8C may have a structure such that phase shift information for controlling the phase rotating unit 5C is obtained based on information regarding an exclusive OR operation between the polarity information of the input of the digital inter-cross wave compensating unit 6C and the polarity information of an error in the output of the adding unit 7C, and the phase shift information is outputted as a phase rotating unit control signal.

Accordingly, in the above-described control unit 8C, frequency correction by phase rotation performed by the phase rotating unit 5C can be reliably controlled by a simple structure.

(b) First Embodiment of the Present Invention

A first embodiment of the present invention will be described with reference to the drawings.

Figure 4:
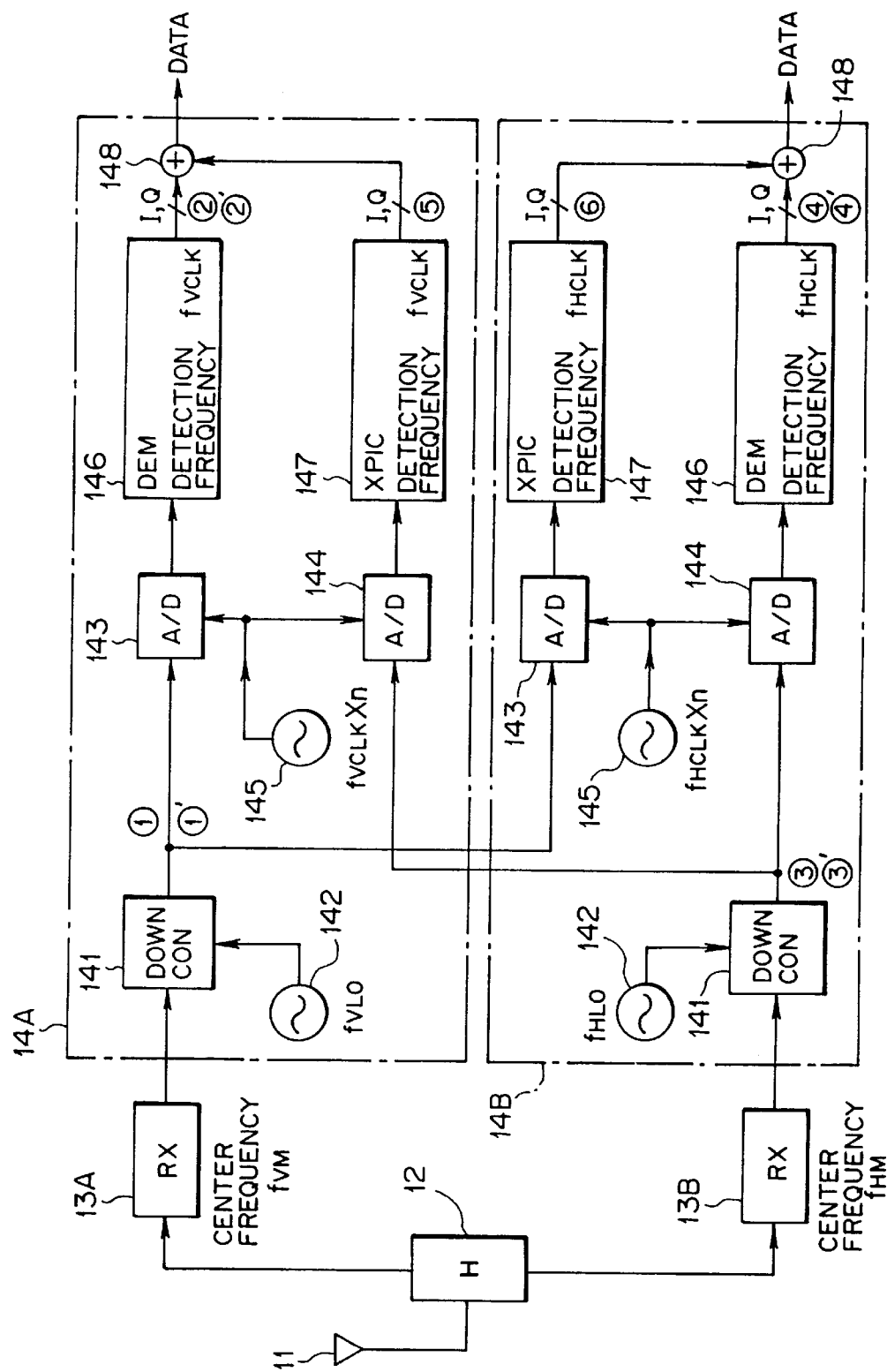
FIG. 4 is a block diagram showing the structure of the receiving section of a radio communication apparatus to which an inter-cross wave compensating apparatus according to a first embodiment of the present invention is applied.

FIG. 4 is a block diagram showing the structure of the receiving section of a radio communication system to which an inter-cross wave compensating apparatus according to the first embodiment of the present invention is applied. In FIG. 4, numeral 11 denotes a receiving antenna for receiving modulated transmission signals (RF signals) which including V and H waves which are individually subjected to a predetermined modulation at an unillustrated transmitting side. Numeral 12 denotes a hybrid (H) for splitting the modulated transmission signals received by the receiving antenna into V and H wave signals. Numerals 13A and 13B denote receiving units (RX) for performing a desired process such as down conversion of the received RF signals to IF signals (center frequencies: $f_{VM}$, $f_{HM}$).

Numerals 14A and 14B denote demodulating units (inter-cross wave compensating apparatuses). In the present embodiment, the demodulating unit 14A is used for V waves, while the demodulating unit 14B is used for H waves. Each of the demodulating units 14A and 14B includes a down converter (DOWN CON) 141, a voltage controlled local oscillator (LO VCO) 142, A/D (analog/digital) converters 143 and 144, a voltage controlled oscillator (CLX VCO) 145 for producing clocks for the A/D converters 143 and 144, a digital demodulating unit (DEM) 146 for performing detection at a detection frequency $f_{VCLK}$ or $f_{HCLK}$, a digital demodulating unit for inter-cross wave compensation (XPIC) 147 for performing detection at a detection frequency $F_{VCLK}$ or $f_{HCLK}$, and an adding unit 148.

Next, the relationship of synchronization between the frequencies of the local oscillator 142 and the voltage controlled oscillator 145 will be described in detail.

The center frequencies of the modulated waves at times indicated by ①–⑥ in FIG. 4 are respectively represented as follows:

① $f_{VM}-f_{VLO}$

② $f_{VM}-f_{VLO}-f_{VCLK}$

③ $f_{HM}-f_{HLO}$

④ $f_{HM}-f_{HLO}-f_{HCLK}$

⑤ $f_{HM}-f_{HLO}-f_{VLCK}$

⑥ $f_{VM}-f_{VLO}-f_{HCLK}$ (7)

The frequencies ①'–④' of interfered waves which have undergone interference in the space are respectively expressed as follows:

①' $f_{HM}-f_{VLO}$

②' $f_{HM}-f_{VLO}-f_{VCLK}$

③' $f_{VM}-f_{HLO}$

④' $f_{VM}-f_{HLO}-f_{HCLK}$ (8)

To perform inter-cross wave compensation at the inter-cross wave compensating unit 147, the following relationships must be satisfied.

⑤=②' (9)

⑥=④' (10)

When the carrier waves of the demodulating units 14A and 14B are synchronized, ②=0 and ④=0. Accordingly, the following equations are given:

$$f_{VLO}=f_{VM}-f_{VCLK}$$ (11)

$$f_{HLO}=f_{HM}-f_{HCLK}$$ (12)

Since the V and H wave signals are synchronized with each other at the transmitting side in the present embodiment, the following equation is satisfied:

$$f_{VM}=f_{HM}$$ (13)

From equations (9) and (11)–(13), the following equation can be obtained:

$$f_{HCLK}=f_{VCLK}$$ (14)

It is understood that synchronization of clocks for V and H waves is required for inter-cross wave compensation at the demodulating units 14A and 14B. A similar result can be obtained from equations (10)–(13).

Figure 5:
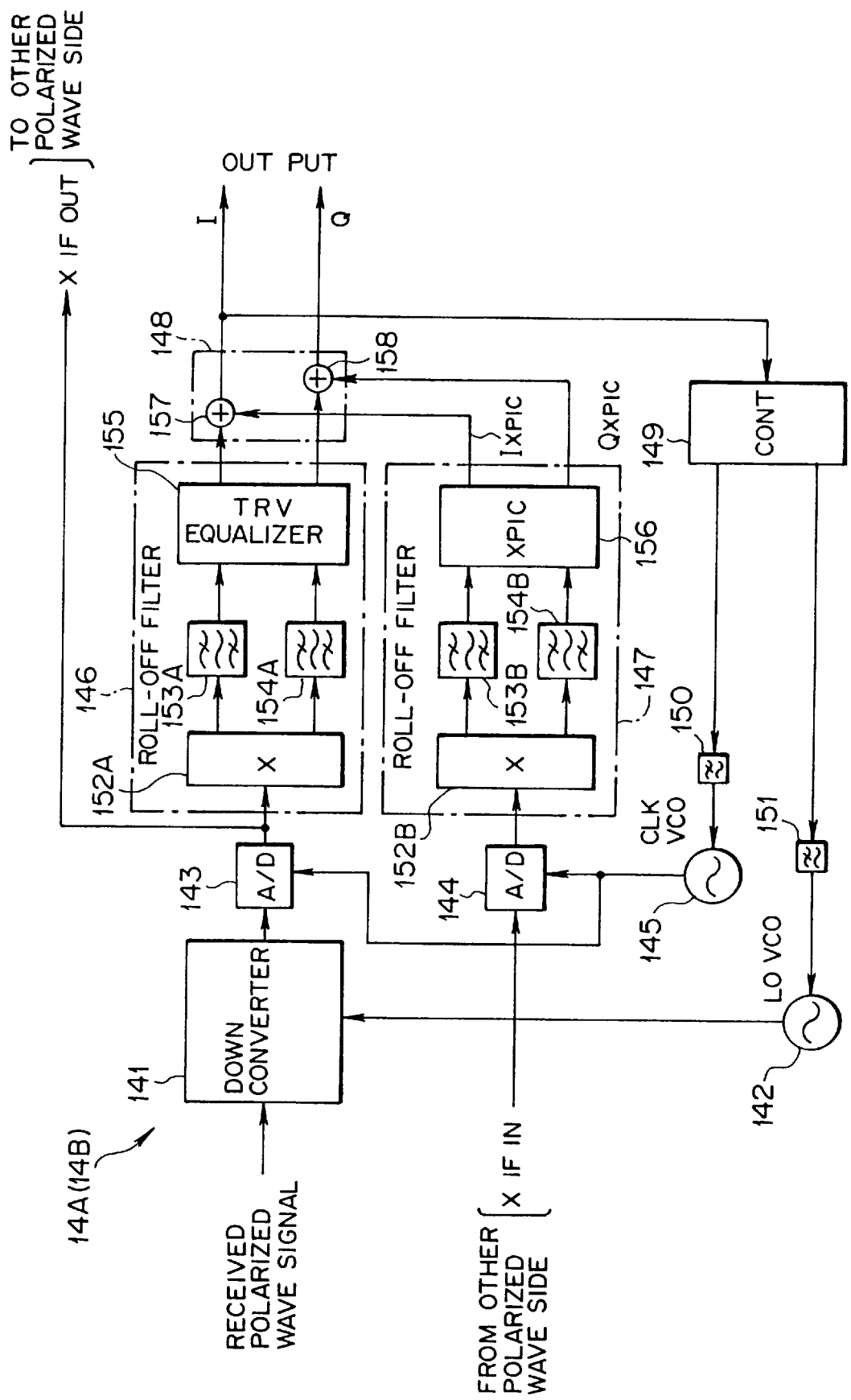
FIG. 5 is a block diagram showing the detail structure of a demodulating unit used in the first embodiment.

FIG. 5 is a block diagram showing the detailed structure of the demodulating unit 14A for V waves which is configured based on the above-described theory. As shown in FIG. 5, the above-described digital demodulating unit 146 includes a digital orthogonal detection unit 152A, roll-off filters 153A and 154A, and a transversal (TRV) equalizer 155. The digital demodulating unit for inter-cross wave compensation 147 includes not only a digital orthogonal detection unit 152B and roll-off filters 153B and 154B, which are identical to those of the digital demodulating unit 146, but also a digital inter-cross wave compensating unit (XPIC) 156 using an FIR filter or the like.

An adding unit 148 is composed of two adders 157 and 158 corresponding to digital demodulated signals I and Q which are obtained by the digital orthogonal detection unit 152A, as will be described later. Numeral 149 denotes a control unit (CONT), and numerals 150 and 151 denote low pass filters. These are not shown in FIG. 4. The demodulating unit 14B for H waves has the same structure as that of the demodulating unit 14A.

In FIG. 5, the down converter (frequency conversion unit) 141 performs frequency conversion (down conversion) for one polarized wave signal (V wave signal) between the two polarized wave signals (V and H wave signals) received by the receiving antenna 11 and intersecting each other, in accordance with a carrier wave regeneration signal (center frequency: $f_{vlo}$) supplied from the voltage controlled oscillator 145. The A/D (analog/digital) converter 143 converts the V wave signal, which has undergone down conversion in the down converter 141, into a digital signal in accordance with timing clocks (center frequency: $f_{VCLK}$) supplied from the voltage controlled oscillator 145.

The digital orthogonal detection unit 152A detects, using trigonometric function signals (sinθ, cosθ), the V wave signal which has been converted into a digital signal by the A/D converter 143 so as to obtain two digital demodulated signals (orthogonal detection signals) I and Q. The roll-off filters 153 and 154 remove noise and the like included in the obtained digital demodulated signals I and Q.

The transversal equalizer (digital equalizing unit) 155 delays the digital demodulated signals I and Q to adaptively infer from past data a distortion component (distortion produced by a transmission line) contained in present data, and controls an internal tap coefficient based on the inferred distortion component. With this operation, the distortion component is removed so that the outputs of the digital orthogonal detection unit 152A are equalized.

In the present embodiment, a signal which is obtained through down conversion of the V wave signal by the down converter 141 and which has not been detected by the digital orthogonal detection unit 152A is outputted to the demodulating unit 143 for H waves as an interference compensation signal (XIF) for compensating the V wave signal which has undergone interference with the H wave signal. More specifically, an analog signal (IF signal) after down conversion of the V wave signal is outputted to the demodulating unit 14B as the interference compensation signal.

In the demodulating unit for inter-cross wave compensation 147, the digital inter-cross wave compensating unit (XPIC) 156 receives a digital signal which is obtained through down conversion of the H wave signal (the other polarized wave signal), between the V and H wave signals received by the receiving antenna 11, performed by the demodulating unit 14B for H waves (the other polarized wave) but which has not been detected by the digital orthogonal detection unit 152A of the demodulating unit 14B for H waves. The digital inter-cross wave compensating unit (XPIC) 156 then outputs compensation signals $I_{XPIC}$ and $Q_{XPIC}$ for compensating the outputs of the transversal equalizer 155.

In this case, an analog signal after down conversion of the H wave signal in the demodulating unit 14B for H waves is inputted to the digital inter-cross wave compensating unit 156 of the demodulating unit 14A. Accordingly, an A/D converter 144 is provided in a stage preceding the digital inter-cross wave compensating unit 156 so as to convert the H wave signal into a digital signal.

This A/D converter 144 converts the H wave signal into a digital signal using timing clocks from the voltage controlled oscillator 145 which are also supplied to the A/D converter 143.

That is, in the demodulating unit 14A shown in FIG. 5, synchronization of carrier waves, which has been described with reference to FIG. 4, is facilitated by providing the A/D converter 144 whose operational clocks are synchronized with the operational clocks of the A/D converter 143 for converting the V wave signal into a digital signal, when an analog signal after down conversion of the V wave signal is used as the signal inputted to the digital inter-cross wave compensating unit 156.

The adding unit 148 adds the output of the transversal equalizer 155 and the output of the digital inter-cross wave compensating unit 156. In detail, the digital demodulated signals I and Q which have been equalized by the transversal equalizer 155 and the compensation signals $I_{XPIC}$ and $Q_{XPIC}$ from the digital inter-cross wave compensating unit 156 are added together by the adders 157 and 158, respectively.

The control unit 149 detects a frequency error, a shift of clock phase, and the like from the digital demodulated signal I (or Q) which has undergone inter-cross wave compensation in the adding unit 148, and performs feedback control for the local oscillator 142 and the voltage controlled oscillator 145 such that down conversion of the V wave in the down converter 141 and A/D conversion in the A/D converters 143 and 144 can be performed at an optimal frequency and clock phase.

In the above-described demodulating unit 14A having the above-described structure, the V wave signal (center frequency: $f_{VM}$) between the V and H wave signals, which are received by the receiving antenna 11 and is split into two waves by the hybrid 12, is subjected to down conversion in the down converter 141 in accordance with a carrier wave regeneration signal (center frequency: $F_{VLO}$) from the local oscillator 142. The V wave signal undergone the down conversion is outputted as a signal which is used for inter-cross wave compensation by the digital inter-cross wave compensating unit (XPIC) 156 of the demodulating unit 143 for H waves. Also, the V wave signal is converted into a digital signal by the A/D converter 143 and is outputted to the detection unit 146.

In the digital demodulating unit 146, the V wave signal, which has been converted into a digital signal, is detected in the digital orthogonal detection unit 152A using trigonometric function signals ($\sin\theta$, $\cos\theta$), so that two digital demodulated signals are obtained. After the noise components and the like included in the digital demodulated signals I and Q are removed by the roll-off filters 153A and 154A, the digital demodulated signals are subjected to an equalizing process for distortion in the transversal equalizer 155.

Meanwhile, the analog signal (H wave signal) which has been subjected to down conversion in the demodulating unit 14B for H waves and which is sent from the demodulating unit 14B as an interference compensation signal is converted into a digital signal by the A/D converter 144 in response to operational clocks which are synchronized with clocks for the A/D converter 143, and is then outputted to the demodulating unit for inter-cross wave compensation 147.

In the demodulating unit for inter-cross wave compensation 147, the digital signal from the A/D converter 144 is orthogonally detected by the digital orthogonal detection unit 152B to obtain two digital signals. After the noise component and the like included in these digital signals are removed by the roll-off filters 153B and 154B, the digital signals are outputted to the digital inter-cross wave compensating unit 156.

In the digital inter-cross wave compensating unit 156, the output of the transversal equalizer 155 is compensated based on the digital H wave signals. That is, compensation signals $I_{XPIC}$ and $Q_{XPIC}$ for compensating the interference component (H wave signal) of the V wave signal are generated and are outputted to the adding unit 148.

As a result, in the adding unit 148, the digital demodulated signals I and Q from the transversal equalizer 155 and the compensation signals $I_{XPIC}$ and $Q_{XPIC}$ from the digital inter-cross wave compensating unit 156 are added together by the adders 157 and 158, and the interference component (H wave signal) of the V wave signal is compensated.

Namely, in the demodulating unit (inter-cross wave compensating apparatus) 14A according to the present embodiment, one polarized wave signal (V wave signal) between two received polarized waves (V and H waves) intersecting each other is subjected to down conversion, and the one of the two signals is converted into a digital signal by the A/D converter 143. Subsequently, the digital signal is detected by the digital orthogonal detection unit 152A (digital demodulating unit), and the digital inter-cross wave compensating unit 156 is supplied with a signal which is obtained through down conversion of the other polarized wave signal (H wave signal) but which has not been detected by the digital orthogonal detection unit 152A. Further, the output (digital demodulated signals I and Q) of the digital orthogonal detection unit 152A for V waves are compensated using the output (compensation signals $I_{XPIC}$ and $Q_{XPIC}$) of the inter-cross wave compensating unit 156.

Accordingly, the process by the A/D converters 143 and 144 and the following processes can be performed in digital, including the inter-cross wave compensation by the digital inter-cross wave compensating unit 156. This makes it possible to perform compensation for inter-cross wave interference with considerably high accuracy.

In addition, the digital orthogonal detection units 152A and 152B, the transversal equalizer 155, the digital inter-cross wave compensating unit 156, and the adding unit 148 can be formed as an LSI. This greatly contributes to decreasing the size and costs of the demodulating unit (inter-cross wave compensating apparatus) 14A (143).

The demodulating unit 143 for H waves has the same structure as that of the demodulating unit 14A for V waves, and compensation for the interference component (V wave signal) of the H wave signal by the demodulating unit 14B for H waves is performed in the same manner as in the demodulating unit 14A for V waves.

(a-1) Modification of First Embodiment

Figure 6:
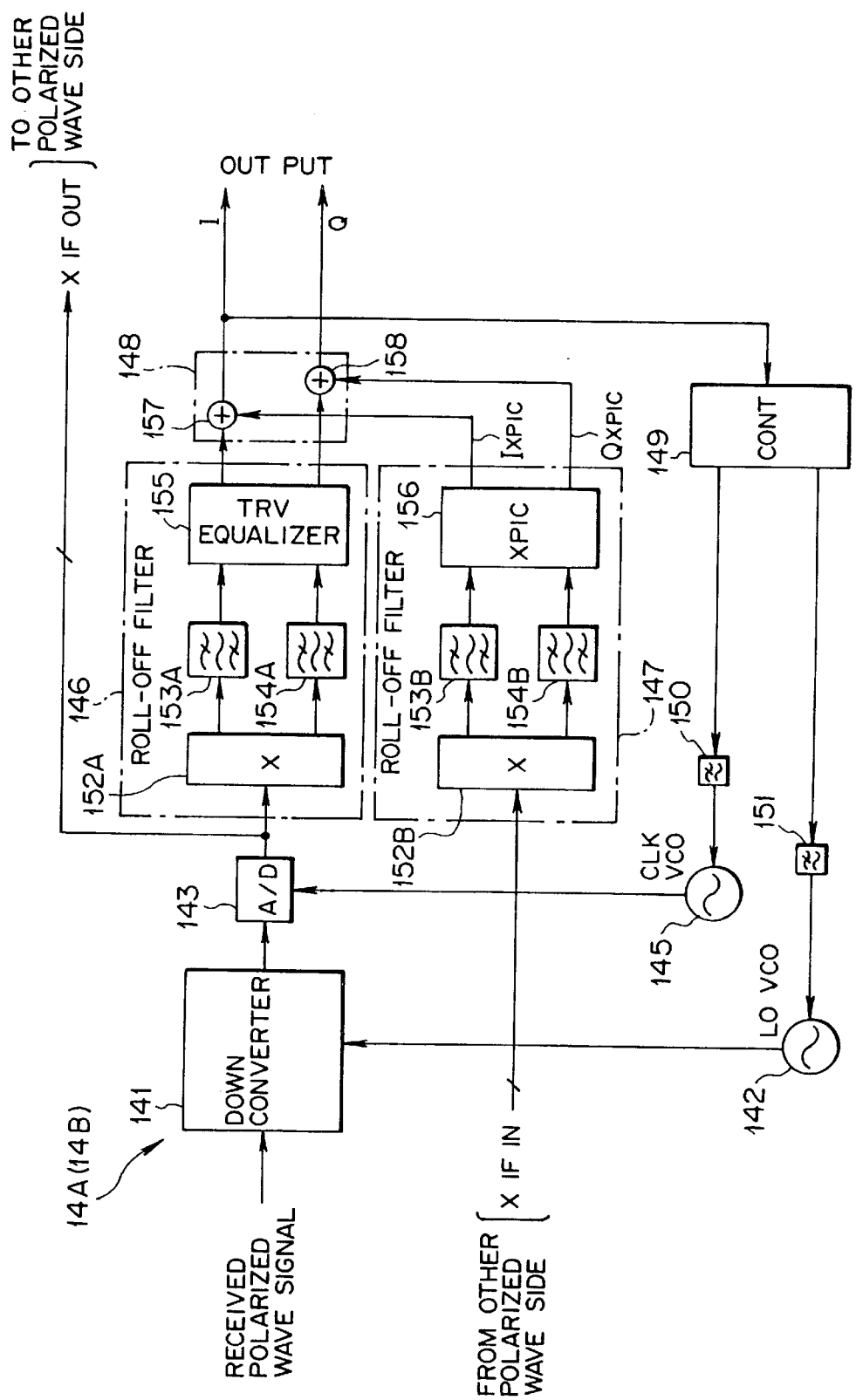
FIG. 6 is a block diagram showing a modification of the demodulating unit used in the first embodiment.

FIG. 6 is a block diagram showing a modification of the above-described demodulating unit 14A. In the demodulating unit 14A for V waves shown in FIG. 6, after the V wave signal is subjected to down conversion in the down converter 141 and is then converted into a digital signal by the A/D converter 143, the digital signal is outputted to the digital inter-cross wave compensating unit 156 for H waves as a signal for compensation of the V wave signal interfering with the H wave signal. Meanwhile, a digital signal which is obtained through down conversion of an H wave signal by the down converter 141 of the demodulating unit 14B for H waves and is then converted into a digital signal by the A/D converter 143 is inputted to the digital inter-cross wave compensating unit 156 for V waves.

Accordingly, in the demodulating unit 14A for V waves shown in FIG. 6, the A/D converter 144 shown in FIG. 5 can be omitted. Consequently, the size of the circuit for the demodulating unit 14A can be further reduced. The detailed operation of the demodulating unit 14A is the same as the operation which has been described with reference to FIG. 5. The structure and operation of the demodulating unit 14B for H waves are the same as those of the demodulating unit 14A for V waves.

When the A/D converter 144 shown in FIG. 5 is omitted by using a digital signal which is obtained through down conversion of an H wave signal by the down converter 141 of the demodulating unit 14B for H waves and is then converted into a digital signal by the A/D converter 143, as a signal inputted to the digital inter-cross wave compensating unit 156 for V waves, transmission of polarized wave signals (digital signals) for interference compensation between the demodulating units 14A and 14B sometimes becomes impossible if the clock phase between the V wave signal and the H wave signal for interference compensation transmitted from the other polarized wave (H wave) side is uncertain.

To overcome the above-described problem, it is preferably in the present embodiment to use an I/O memory (read/write memory) 161 instead of the A/D converter 144 shown in FIG. 5A. The I/O memory 161 is disposed in a stage preceding the digital inter-cross wave compensating unit 156.

Figure 8:
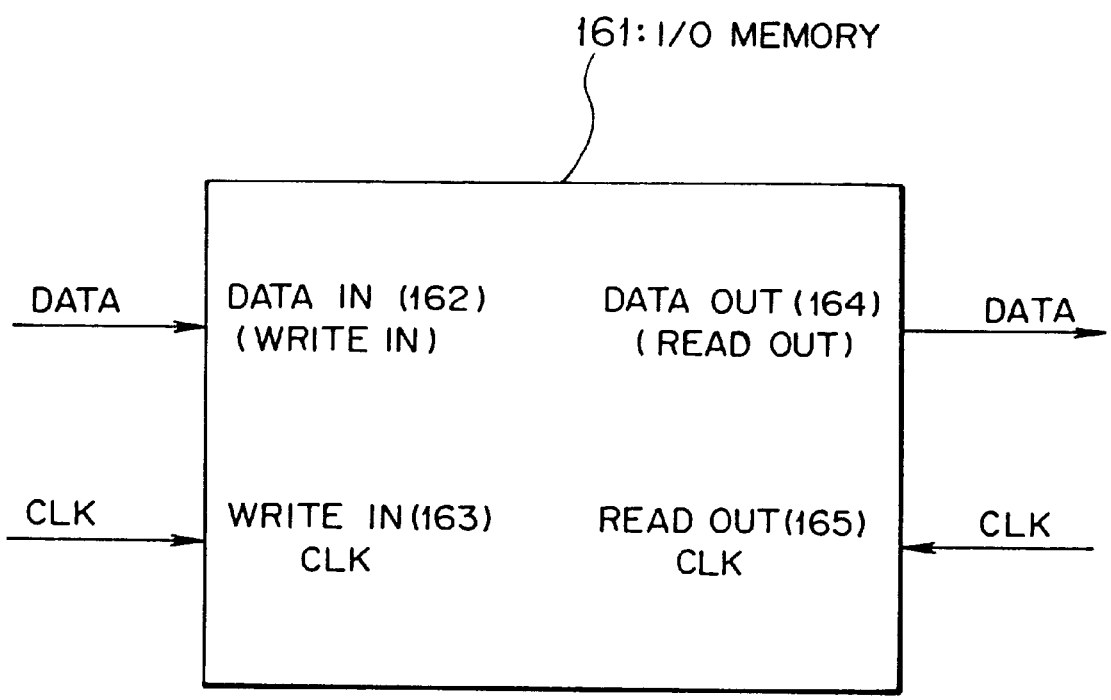
FIG. 8 is a block diagram showing the structure of an I/O memory used in the first embodiment.

The I/O memory 161 has, for example, four input/output ports 162–165, as shown in FIG. 8. Data of the H wave signal (DATA) from the demodulating unit 14B for H waves are written into the memory 161 through the port 162 in accordance with the timing of clocks (CLK) in the demodulating unit 14B for H waves which are inputted to the port 163. The data of the H wave signal written into the I/O memory 161 through the port 162 are read out through the port 164 in accordance with the timing of clocks from the voltage controlled oscillator 145, which are inputted to the port 165.

In other words, in the demodulating unit 14A for V waves, data of the H wave signal which are converted into a digital signal by A/D conversion in accordance the timing clocks from the voltage controlled oscillator 145 in the demodulating unit 14B for H waves and are transmitted to the demodulating unit 14A are read out from the I/O memory 161 in accordance with the timing clocks from the own voltage controlled oscillator 145 (of the demodulating unit 14A for V waves). With this operation, uncertainty of the clock phase between the V wave signal and the H wave signal for interference compensation can be eliminated.

Accordingly, even in the case where a digital signal which is obtained through down conversion of an H wave signal in the demodulating unit 14B for H waves and is then converted into a digital signal by the A/D converter 143 for H waves is used as a signal inputted to the digital inter-cross wave compensating unit 156 for V waves, uncertainty of the clock phase between two polarized waves (the V and H waves) can be eliminated, and the exchange of the V and H wave signals between the demodulating units 14A and 14B can be stably and reliably performed in digital even when the wave signals include jitter and the like.

Figure 7:
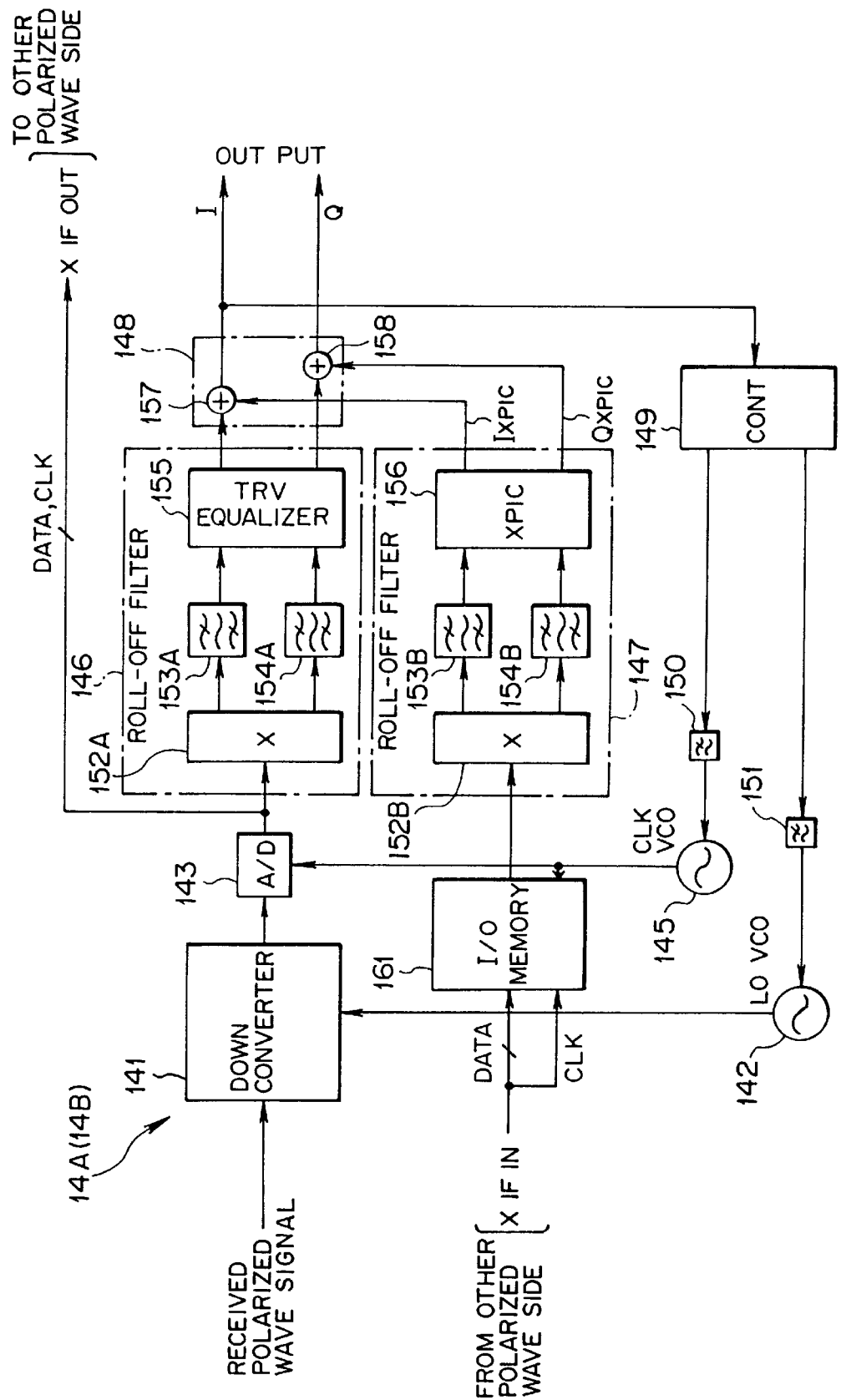
FIG. 7 is a block diagram showing another modification of the demodulating unit used in the first embodiment.

In this modification, the demodulating unit 14B for H waves also has the same structure as that of the demodulating unit 14A for V waves shown in FIG. 7, and compensation for the interference component (V wave signal) of the H wave signal by the demodulating unit 14B for H waves is performed in the same manner as in the demodulating unit 14A for V waves.

(c) Second Embodiment of the Present Invention

Figure 9:
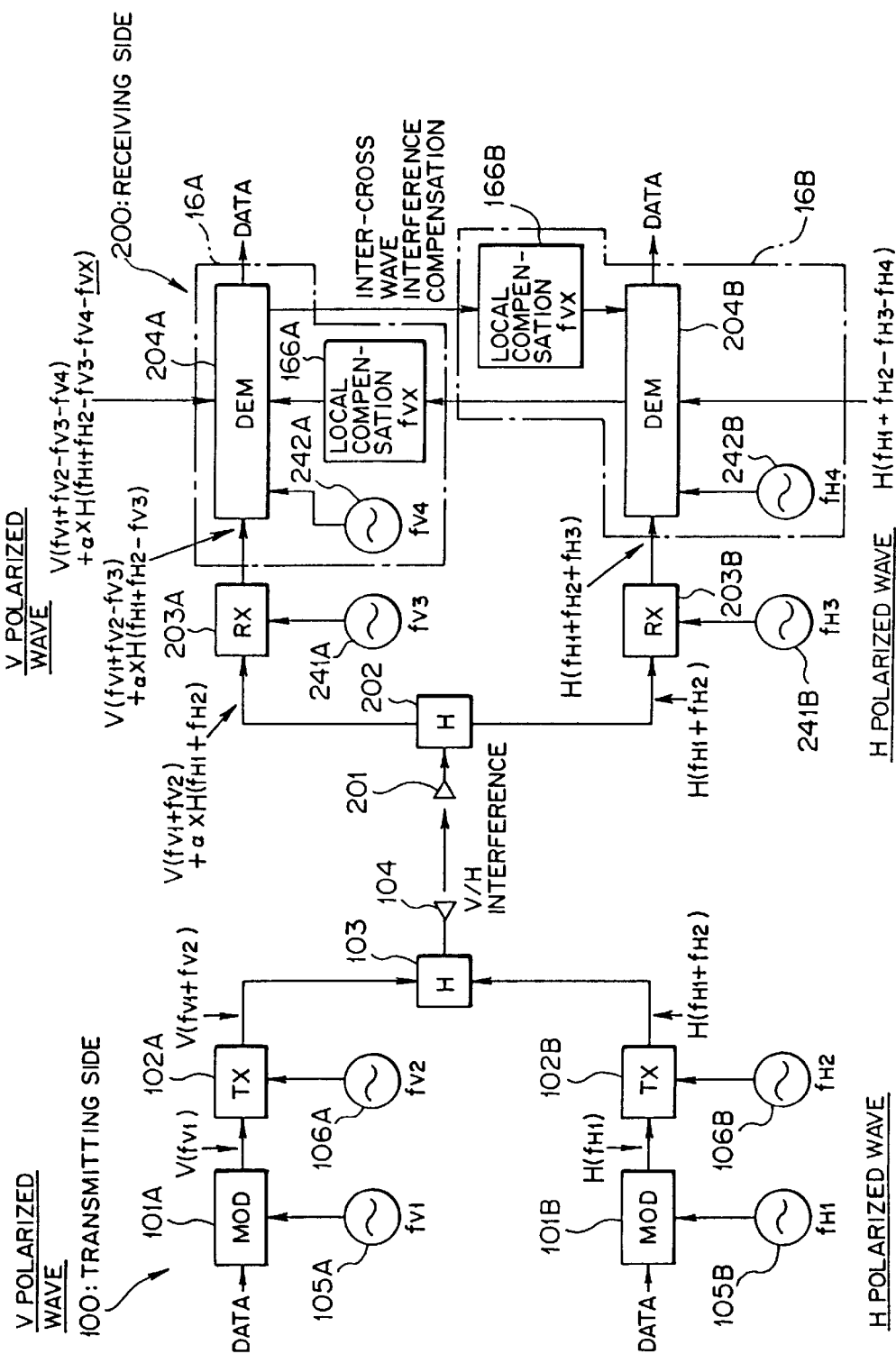
FIG. 9 is a block diagram showing a second embodiment of the present invention.
Figure 26:
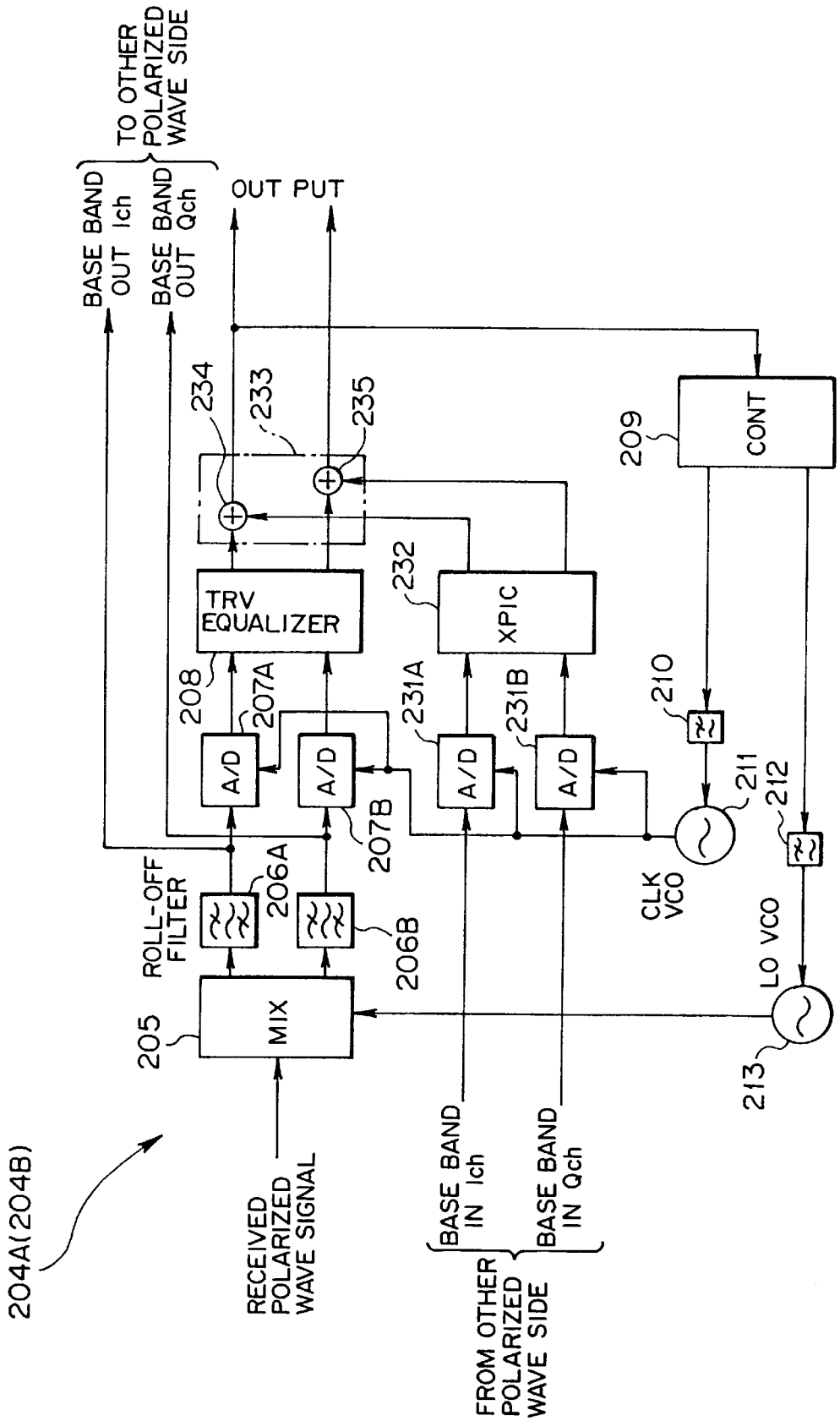
FIG. 26 is a block diagram showing an example of the structure of a demodulating unit of an analog demodulation type which is used when a general inter-cross wave interference compensation is performed.
Figure 27:
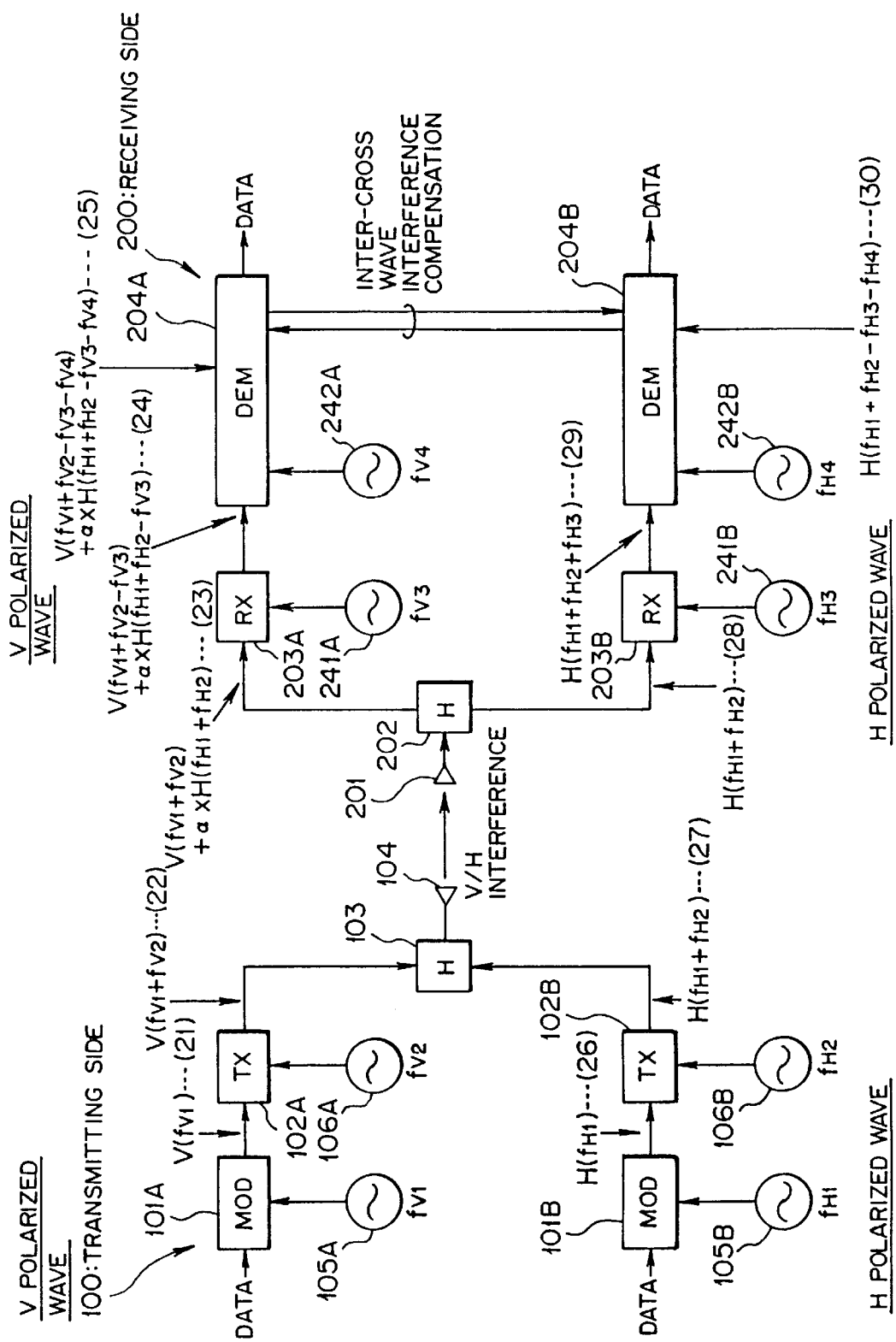
FIG. 27 is a diagram showing an example of the relationship between frequencies in the general inter-cross wave interference compensation.

FIG. 9 is a block diagram showing a second embodiment of the present invention. FIG. 9 shows an example of the relationship between frequencies in the case where a so-called co-channel transmission (transmission using V and H waves) is performed as described above with reference to FIG. 27. Portions in FIG. 9 which are denoted by the same reference numbers as those used in FIG. 26 are identical to units and elements as those which have been described with reference to FIG. 27. However, in the present embodiment, local compensating units 166A and 166B are provided in the receiving side 200 so as to perform frequency compensation (correction), using frequencies $f_{VX}$ and $f_{HX}$, for signals for inter-cross wave compensation exchanged between the demodulating units 204A and 204B for V and H waves when inter-cross wave compensation is performed.

In other words, in the present embodiment, synchronization of carrier waves in the demodulating units 204A and 204B is not established in the transmitting side 100, but is established in the receiving side 200 by using the frequencies $f_{VX}$ and $f_{HX}$ of the local compensating units 166A and 166B.

For the sake of convenience, in the present embodiment, the portion including the local compensating unit 166A, the demodulating unit 204A, and the voltage controlled oscillator 242A will be referred to as a demodulating unit 16A for V waves, while the portion including the local compensating unit 166B, the demodulating unit 204B, and the voltage controlled oscillator 242B will be referred to as a demodulating unit 16B for H waves.

Figure 10:
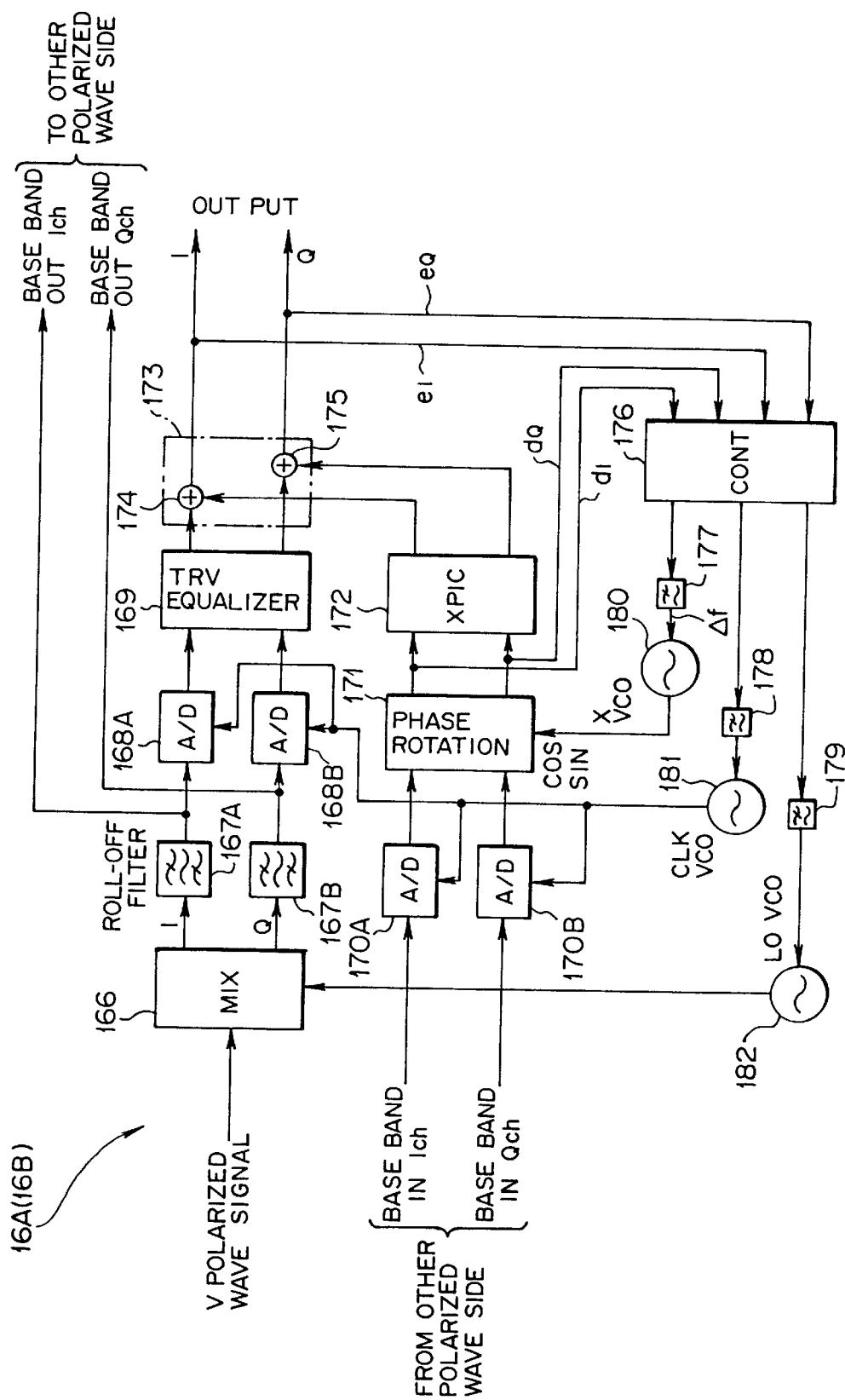
FIG. 10 is a block diagram showing the structure of a demodulating unit used in the second embodiment.

FIG. 10 is a block diagram showing the structure of the demodulating unit 16A. In FIG. 10, numeral 166 denotes a mixer (MIX), numerals 167A and 167B denote roll-off filters, numerals 168A, 168B, 170A and 170B denote A/D converters, numeral 169 denotes a transversal (TRV) equalizer, numeral 171 denotes a phase rotating unit, numeral 172 denotes a digital inter-cross wave compensating unit (XPIC), numeral 173 denotes an adding unit, numeral 176 denotes a control unit (CONT), numerals 177–179 denote low pass filters, numeral 180 denotes a voltage controlled oscillator (X VCO) for the phase rotating unit 171, numeral 181 denotes a voltage controlled oscillator (CLK VCO) for generating clocks for the A/D converters 168A, 168B, 170A and 170B, and numeral 182 denotes a voltage controlled local oscillator (LO VCO) for the mixer 166. The local oscillator 182 corresponds to the voltage controlled oscillator 242B shown in FIG. 9.

The mixer (analog orthogonal detection unit) 166 performs frequency conversion (down conversion) for one received wave signal (e.g., V wave signal) between two polarized wave signals (V and H wave signals), which are transmitted from the transmitting side 100 (see FIG. 9) without establishing synchronization during modulation for transmission and which intersect each other, in accordance with a carrier wave regeneration signal supplied from the local oscillator 182, which will be described later. The mixer 166 then detects the V wave signal to obtain two orthogonal detection signals (base band signals) I and Q. That is, the mixer 166 forms a homodyne detection unit in the present embodiment.

In the present embodiment, the base band signals (analog signals) I and Q which are obtained by detecting the V wave signal by the mixer 166 but which have not been converted into digital signals by the A/D converters 168A and 168B are outputted to the demodulating unit 163 for H waves as an interference compensation signal for compensating the V wave signal interfering with the H wave signal.

The roll-off filters 167A and 167B remove the noise components and the like of the orthogonal detection signals I and Q. The A/D converters 168A and 168B (first analog/digital converters) convert the two orthogonal detection signals I and Q obtained by the mixer 166 into digital signals in accordance with timing clocks for A/D conversion supplied from the voltage controlled oscillator 181 for clock regeneration, which will be described later. As a result, digital demodulated signals I and Q are obtained.

The transversal equalizer 169 is the same as that described in the first embodiment. The transversal equalizer 169 delays the digital demodulated signals I and Q to adaptively infer from past data a distortion component (distortion produced by a transmission line) contained in present data, and controls an internal tap coefficient based on the inferred distortion component. With this operation, an equalizing process is performed for the digital demodulated signals I and Q obtained by the A/D converters 168A and 168B.

The A/D converters 170A and 170B (second analog/digital converters) convert analog H wave signals (the other received polarized wave signals) which are transmitted from the demodulating unit 16B for H waves into digital signals, in accordance with timing clocks for A/D conversion which are supplied from the voltage controlled oscillator 181 as for the A/D converters 168A and 168B, i.e., in the state in which the operational clocks for the A/D converters 170A and 170B are synchronized with the operational clocks for the A/D converters 168A and 168B.

In the present embodiment, two base band signals (analog signals) I and Q which are detected as two orthogonal detection signals I and Q by the mixer 166 for H waves but which have not been converted into digital signals by the A/D converters 168A and 168B for H waves are transmitted from the demodulating unit 16B for H waves as H wave signals for compensation.

Figure 11:
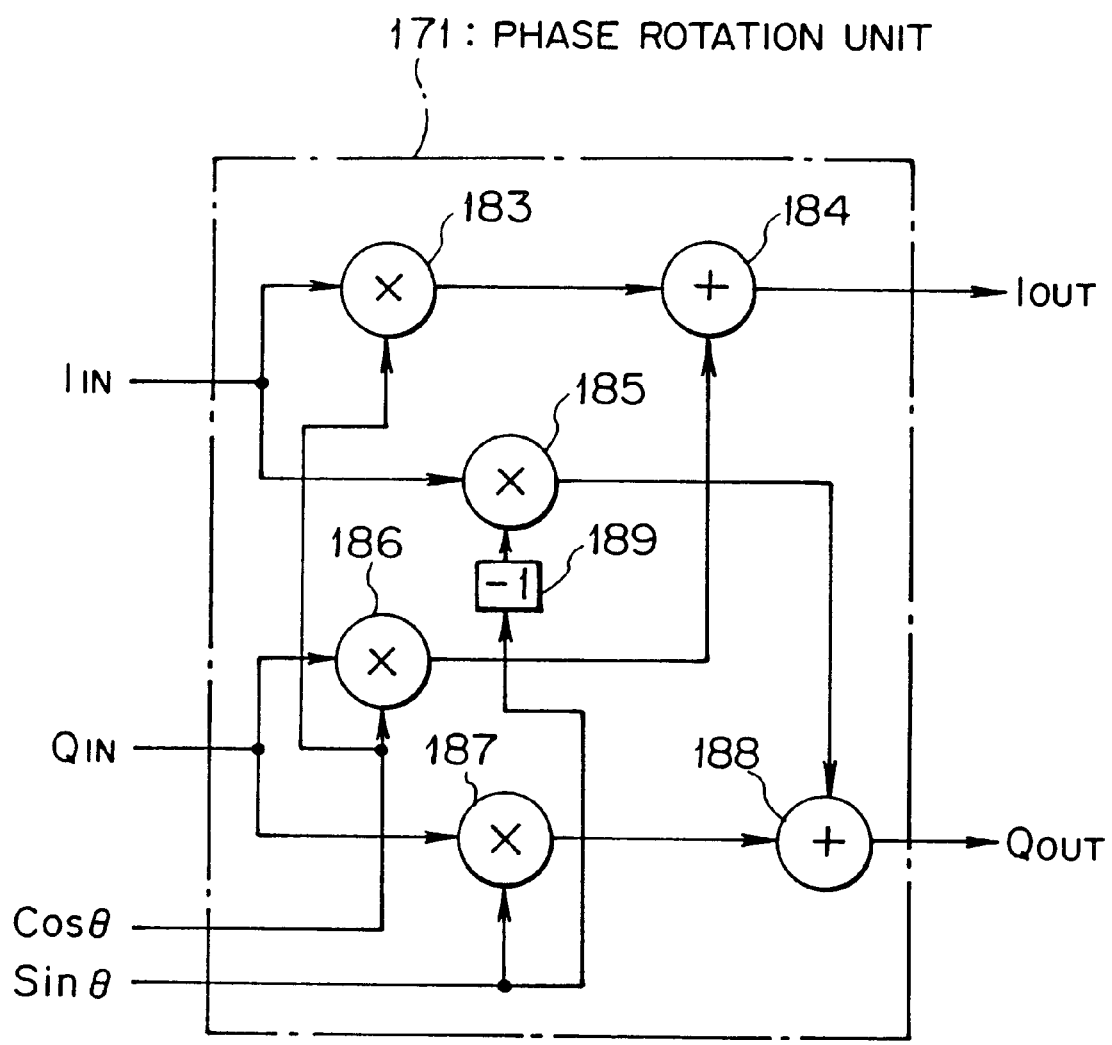
FIG. 11 is a block diagram showing the structure of a phase rotating unit used in the second embodiment.

The phase rotating unit 171 performs phase rotation for the outputs of the A/D converters 170A and 170B in accordance with trigonometric function signals (sinθ, cosθ) supplied from the voltage controlled oscillator 180 so as to carry out frequency correction. In the present embodiment, for example, an inverter 189 is provided, as shown in FIG. 11, to multiply signal values inputted to the multipliers 183–188 by "−1", thereby inverting the signal values. When the digital signals inputted from the A/D converters 170A and 170B are represented by $I_{IN}$ and $Q_{IN}$, and the outputs are represented by $I_{OUT}$ and $Q_{OUT}$, the following operation is performed:

$$I_{OUT}=I_{IN}\cdot\cos\theta-Q_{IN}\cdot\sin\theta \qquad (15)$$

$$Q_{OUT}=I_{IN}\cdot\sin\theta-Q_{IN}\cdot\cos\theta \qquad (16)$$

With this calculation, frequency correction is performed for the input digital signals $I_{IN}$ and $Q_{IN}$.

The digital inter-cross wave interference compensating unit 172 receives outputs ($I_{OUT}$ and $Q_{OUT}$) of the phase rotating unit 171 and outputs compensation signals $I_{XPIC}$ and $Q_{XPIC}$ for compensating the output of the transversal equalizer 169. The adding unit 173 adds the output of the transversal equalizer 169 and the output of the digital inter-cross wave compensating unit 172 together. In detail, the digital demodulated signals I and Q for which an equalization process has been performed by the transversal equalizer 169 and the compensation signals $I_{XPIC}$ and $Q_{XPIC}$ from the digital inter-cross wave compensating unit 172 are added together by the adders 174 and 175.

The control unit 176 detects a frequency error due to lost of synchronization between the V and H wave signals based on information regarding the input of the digital inter-cross wave compensating unit 172 and error signals (information regarding output) of the digital demodulated signals I and Q output from the adding unit 173, and controls the oscillation frequency (cosθ, sinθ) of the voltage controlled oscillator 180 in accordance with the detected frequency error, thereby controlling the frequency correction in the phase rotating unit 171.

Figure 12:
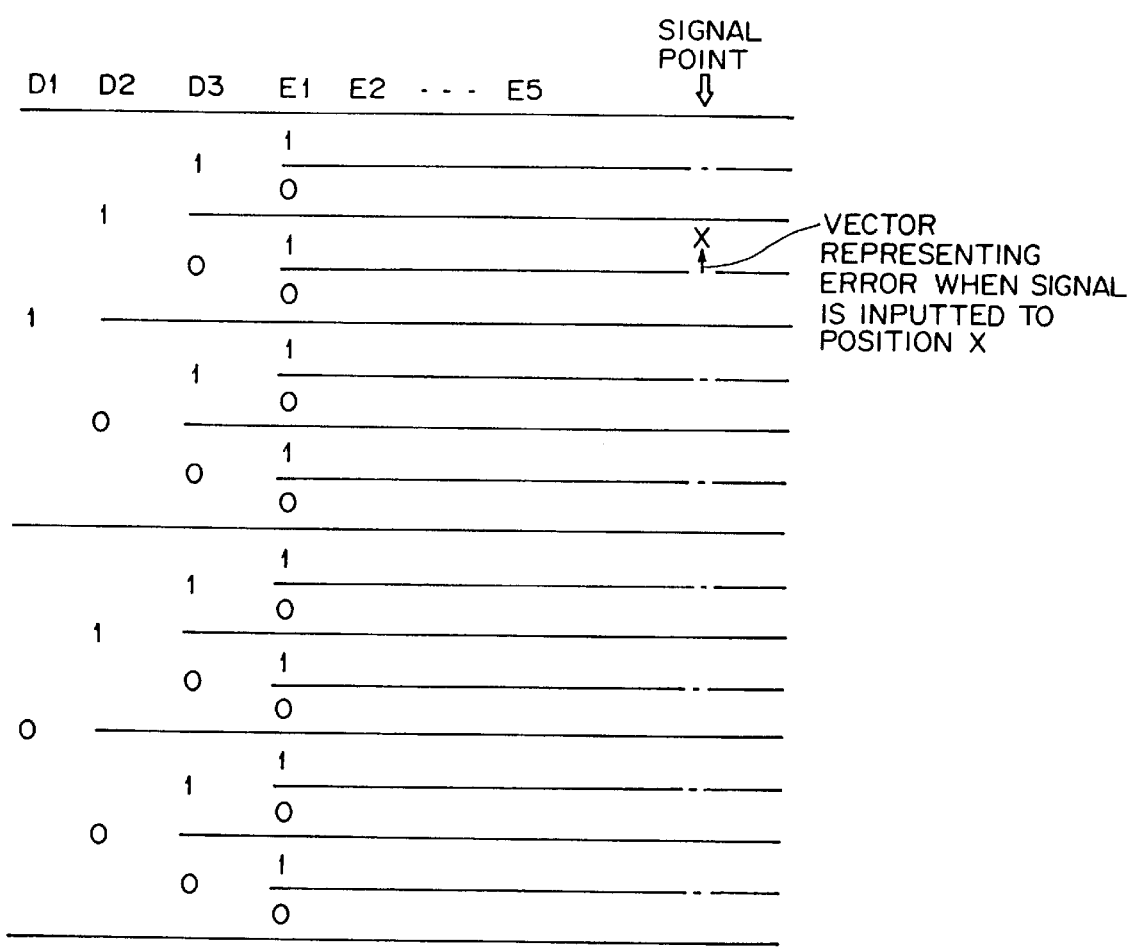
FIG. 12 is an illustration for explaining an error signal used in the demodulating unit of the second embodiment.

The above-described error signals are represented by bits lower than signal bits of the digital demodulated signal I. For example, in the case where the modulation method of the transmission signal is 64 QAM and has an accuracy of 8 bits, 5 bits (E1–E5) lower than 3 signal bits (D1–D3) represent an amount of an error (error signal), as shown in FIG. 12. Accordingly, error θ can be represented by the following equation:

$$e=2^4\cdot E1+2^3\cdot E2+2^2\cdot E3+2^1\cdot E2+E1 \qquad (17)$$

When the errors of the digital demodulated signals I and Q are represented by $e_I$ and $e_Q$, respectively, and an amount of deviation from the synchronized state (phase shift amount) of the H wave signal is represented by Δθ, the error $e_I$ ($e_Q$) is represented as follow:

$$e_I(e_Q)=\alpha H(f)-\alpha' H(f-\Delta\theta) \qquad (18)$$

α and α' are substantially equalized by the inter-cross wave compensating unit 172.

Figure 13:
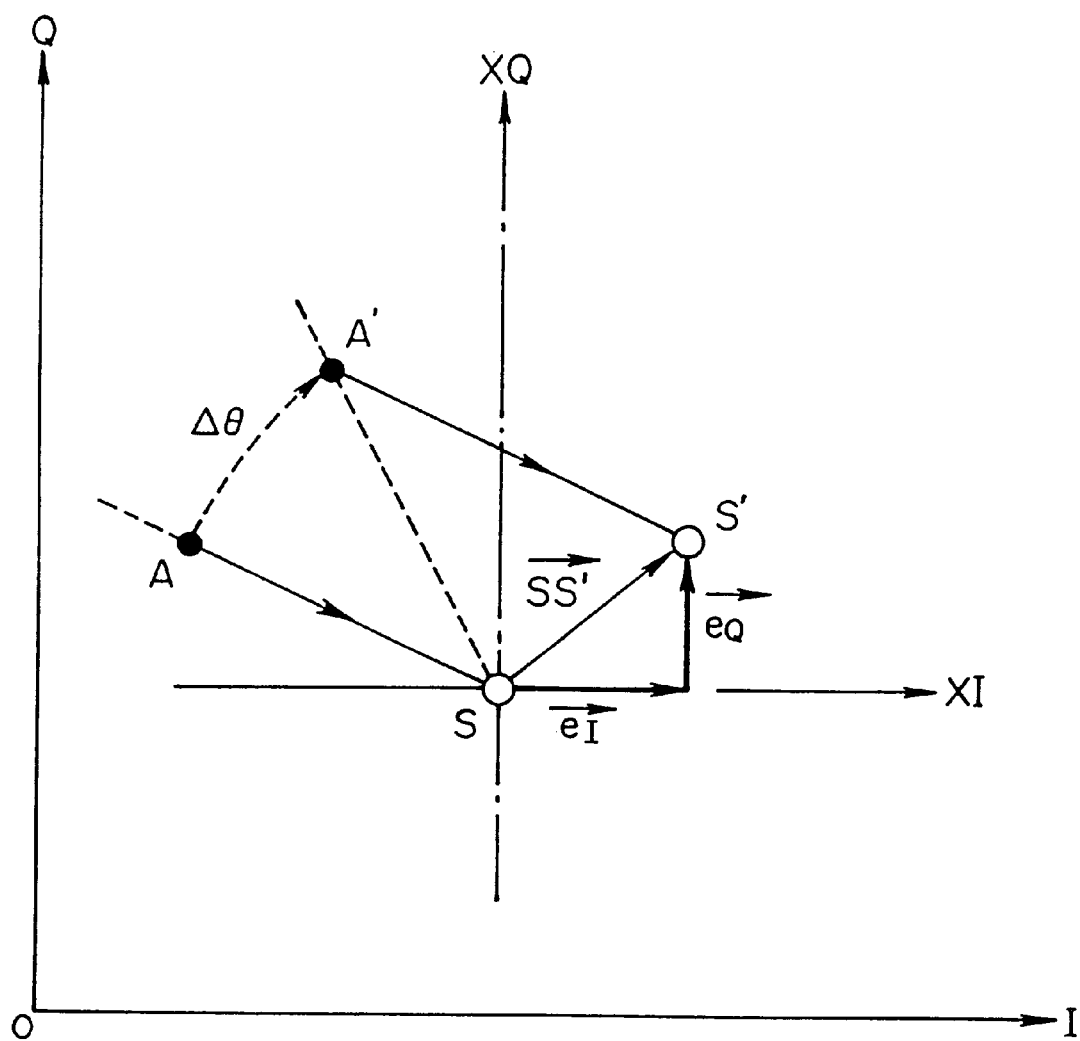
FIG. 13 is an illustration for explaining an operation for obtaining a phase error in the demodulating unit of the second embodiment.

For example, the transmission signal has been modulated by a QPSK (Quadri-Phase Shift Keying) and a signal point A to be compensated by the inter-cross wave compensating unit 172 is located at a point A' offset from the signal point A, as shown in FIG. 13. The signal point A, which must be compensated by the inter-cross wave compensating unit 172 to be located at a point S (the origin of an XI–XQ coordinate system), is compensated to be located at a point S'.

Since the Δθ is proportional to a vector SS' starting from the point S, Δθ can be considered to be equal to the vector SS' by approximation. Also, the vector equation SS'$\rightleftharpoons e_I+e_Q$ is satisfied. Accordingly, when the magnitudes of the input signals (H wave signals) of the digital inter-cross wave compensating unit 172 are represented by $d_I$ and $d_Q$, and the polarity bits of $d_I$ and $d_Q$ (polarity information of 1 bit which corresponds to D1 in FIG. 12) are represented by $d_{I(D1)}$ and $d_{Q(D1)}$, the phase error Δθ is represented as follows.

$$\Delta\theta\rightleftharpoons e_I\times d_{Q(D1)}-e_Q\times d_{I(D1)} \qquad (19)$$

Accordingly, if the control unit 176 calculates the phase error $\Delta\theta$ by equation (19) and outputs the phase error to the voltage controlled oscillator 180, the voltage control oscillator 180 can control the oscillation frequency ($\sin\theta$, $\cos\theta$) such that the phase error $\Delta\theta$ becomes "zero"

Figure 14:
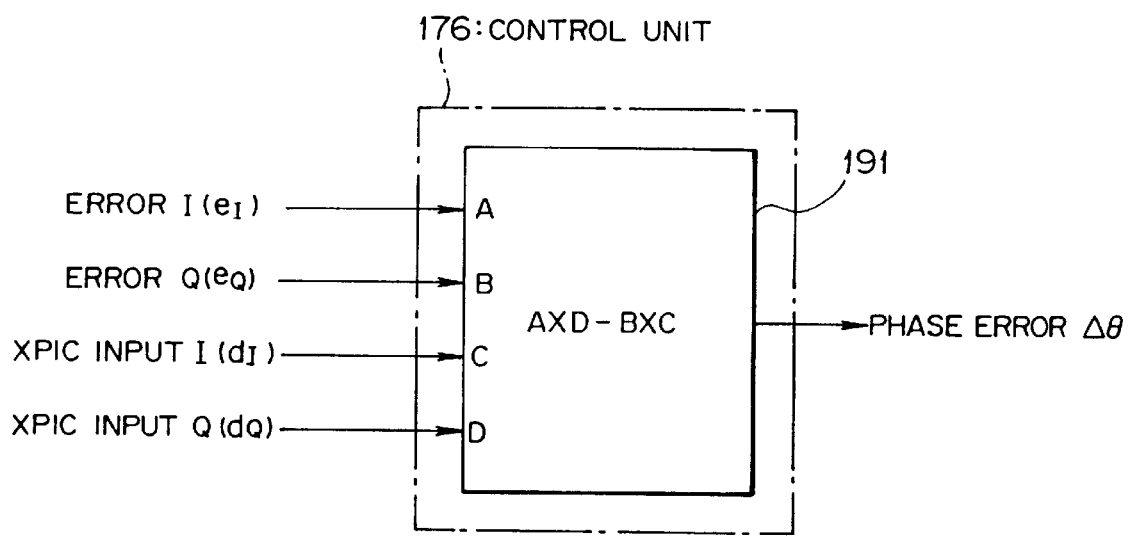
FIG. 14 is a block diagram showing the structure of a control unit used in the second embodiment.

Therefore, the control unit 176 is formed by using a memory 191 which inputs the error information $e_I$ (A) and $e_Q$ (B) of the digital demodulated signals I and Q, the polarity information $d_{I(D1)}$ (C) and $d_{Q(D1)}$ (D) of the input signals of the digital inter-cross wave compensating unit 172 and performs the calculation "A×D−B×C", as shown in FIG. 14, for example.

That is, the control unit 176 obtains a phase error (phase shift information) $\Delta\theta$ based on the polarity information $D_{I(D1)}$ and $D_{Q(D1)}$ of the input signals of the digital inter-cross wave compensating unit 172 and the error information $e_I$ and $e_Q$ regarding the output of the adding unit 173, and outputs the phase error as a control signal for the phase rotating unit 171. The control unit 176 may be formed by a conversion table for outputting a phase error $\Delta\theta$ corresponding to values of the above-described four inputs (A–D).

The voltage controlled oscillator 180 inputs an error $\Delta f$ of the oscillation frequency obtained by integrating the phase error $\Delta\theta$ from the control unit 176 by the low pass filter 177, and produces an oscillation frequency ($\sin e$, $\cos\theta$) such that the frequency error $\Delta f$ becomes "zero", and outputs the oscillation frequency to the phase rotating unit 171.

For this purpose, the voltage controlled oscillator 180 includes an accumulator 192 composed of an adder 193 and a flip flop (FF) circuit 194, and a memory (ROM) 195. Values ($\cos\theta$, $\sin\theta$) which can be obtained by integrating the frequency error $\Delta f$ by the accumulator 192 are generated by the memory 195 and are supplied to the phase rotating unit 171.

In the demodulating unit 16A for V waves having the above-described structure, the V wave signal between the received V and H wave signals is subjected to down conversion by the mixer 166 in accordance with a carrier wave regeneration signal from the local oscillator 182, and orthogonal detection is performed to obtain two orthogonal detection signals I and Q, from which the respective noise components and the like are removed by the roll-off filters 167A and 167B.

The orthogonal detection signals I and Q are outputted to the demodulating unit 16B for H waves as a signal used for inter-cross wave compensation by the digital inter-cross wave compensating unit (XPIC) for H waves. Also, the orthogonal detection signals I and Q are converted into digital signals I and Q by the A/D converters 168A and 168B, and are subjected to an equalization process for distortion performed by the transversal equalizer 169.

Meanwhile, the base band signals I and Q transmitted from the demodulating unit 204B for H waves which are obtained by detecting the H wave signal by the mixer 166 for H waves but which have not been converted into digital signals by the A/D converters 168A and 168B for H waves are converted into digital signal I and Q by the A/D converters 170A and 170B in accordance with operational clocks synchronized with the A/D converters 168A and 168B and outputted to the phase rotating unit 171.

At this time, the memory unit 191 in the control unit 176 performs the calculation "A×D−B×C" by using the polarity bits $d_{I(D1)}$ (C) and $d_{Q(D1)}$ (D) of the input of the digital inter-cross wave compensating unit 172 and the error information $e_I$ (A) and $e_Q$ (B) regarding the digital demodulated signals I and Q output from the adding unit 173, as have been described with reference to FIG. 14. With this operation, the phase error $\Delta\theta$ representing the amount of deviation from the synchronized state between the V and H wave signals is detected. Moreover, after the phase error $\Delta\theta$ is integrated by the low pass filter 177, the $\Delta\theta$ is outputted to the voltage controlled oscillator 180. The voltage controlled oscillator 180 then supplies the phase rotating unit 171 with trigonometric function signals ($\sin\theta$, $\cos\theta$) such that the phase error $\Delta\theta$ (frequency error $\Delta f$) becomes "zero".

The phase rotating unit 171 receives the trigonometric signals from the voltage controlled oscillator 180, and performs the operation represented by equations (15) and (16) for the digital signals $I_{IN}$ and $Q_{IN}$ inputted from the A/D converters 170A and 170B, wherein the operation is performed by the multipliers 183–188 and the inverter 189 (see FIG. 11). As a result, frequency correction is performed for the digital signals $I_{IN}$ and $Q_{IN}$, so that the deviation from the synchronized state between the V and H wave signals is compensated. After that, the digital signals $I_{IN}$ and $Q_{IN}$ are outputted to the digital inter-cross wave compensating unit 172.

As a result, in the adding unit 173, the digital demodulated signals I and Q for which an equalization process has been performed by the transversal equalizer 169 and the compensation signals $I_{XPIC}$ and $Q_{XPIC}$ generated by the digital inter-cross wave compensating unit 172 are added together by the adders 174 and 175, so that the output of the transversal equalizer 169 interfering with the H wave signal is compensated.

The compensation of the interference component (V wave signal) of the H wave signal by the demodulating unit 163 for H waves is performed in the same manner as in the demodulating unit 16A for V waves.

Summarily, in the demodulating unit (inter-cross wave compensating apparatus) 16A according to the present embodiment, the V wave signal (one received polarized wave signal) between the V and H waves signals which are transmitted without synchronization during modulation for transmission is subjected to down conversion and detection by the mixer 166, and phase rotation is performed, by the phase rotating unit 171, for the H wave signal for interference compensation transmitted from the demodulating unit 16B for H waves (signal obtained through down conversion for the other received polarized wave signal) so as to compensate the deviation from the synchronized state between the V wave signal and the H wave signal for interference compensation (frequency error) After that, the compensated signal is supplied to the inter-cross wave compensating unit (XPIC) 172, and the output of the demodulating unit 204A for H waves is compensated by using the output of the inter-cross wave compensating unit 172.

Accordingly, in the demodulating unit (inter-cross wave compensating apparatus) 16A (16B), inter-cross wave compensation can be extremely easily performed without establishing synchronization between the V wave signal and the H wave signal for interference compensation during modulation for transmission at the transmitting side. This greatly contributes to decreasing the costs of inter-cross wave interference compensation.

In addition, since the H and V wave signals are not synchronized at the transmitting side, fine adjustment of frequencies for synchronization between the V wave signal and the H wave signal for interference compensation (the H wave signal and the V wave signal for interference compensation) can be extremely easily performed.

The phase error $\Delta\theta$ which is detected by the control unit 176 to control the phase rotating unit 171 is calculated from the polarity bits $d_{I(D1)}$ and $d_{Q(D1)}$ of the input signals of the digital inter-cross wave compensating unit 172 and the error information $e_I$ and $e_Q$ regarding the output of the adding unit 173. However, the phase error $\Delta\theta$ may be obtained from an exclusive OR operation between the the polarity bits $d_{I(D1)}$ and $d_{Q(D1)}$ of the input signals of the digital inter-cross wave compensating unit 172 and the polarity bits $e_{I(D1)}$ and $e_{Q(D1)}$ of the errors $e_I$ and $e_Q$ regarding the output of the adding unit 173.

Figure 16A:
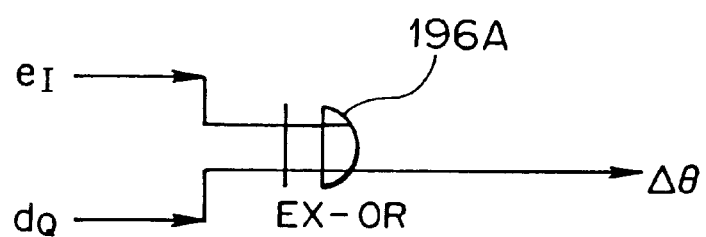
FIGS. 16(a) and 16(b) are block diagrams showing other structures of the control unit used in the second embodiment.

In this case, the control unit 176 is realized by only an exclusive OR gate (exclusive-OR operation element) 196A which inputs the polarity bits $e_{I(D1)}$ and $d_{Q(D1)}$, as shown in FIG. 16A, for example. Alternatively, the control unit 176 is realized by an exclusive OR gate 196B which inputs the polarity bits $e_{Q(D1)}$ and $d_{I(D1)}$ and an inverting gate 197, as shown in FIG. 16B.

Figure 16B:
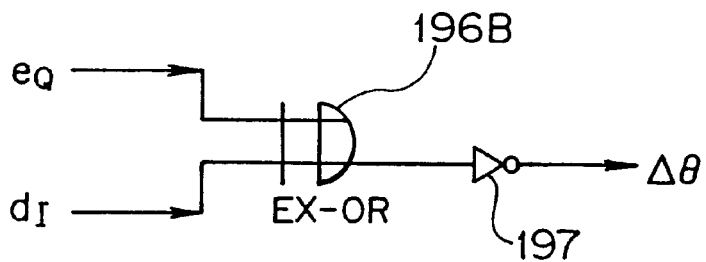
Figure 17:
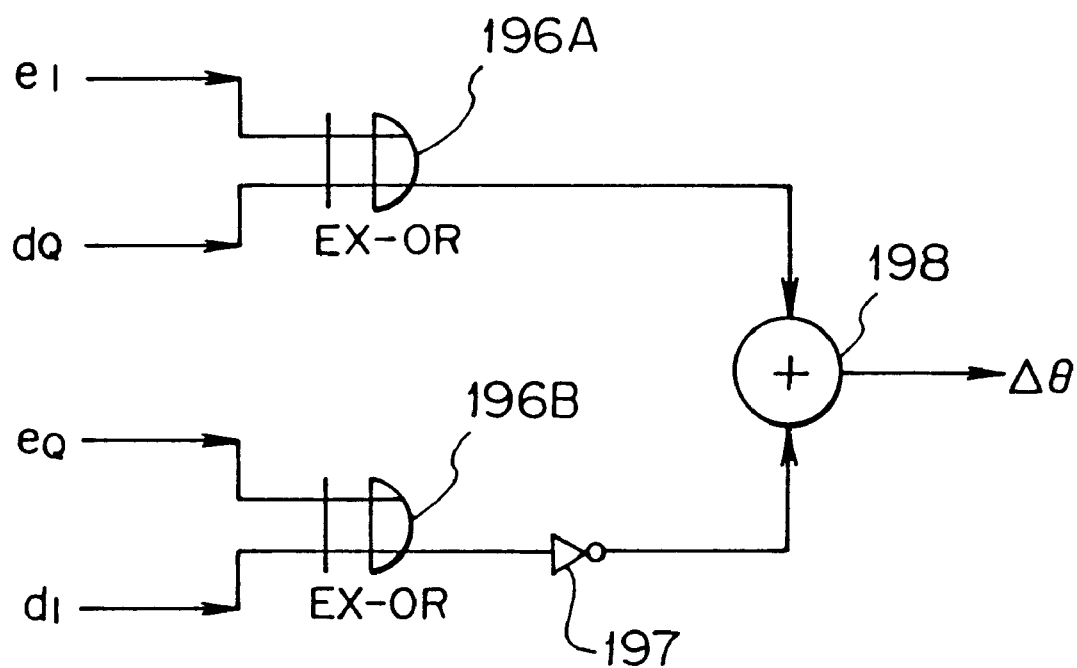
FIG. 17 is a block diagram showing another structure of the control unit used in the second embodiment.

In the control unit 176, the phase error $\Delta\theta$ can be obtained with improved accuracy by providing an adder 198, as shown in FIG. 17, which obtains the sum of the outputs of the circuits shown in FIGS. 16A and 16B.

(b-1) Modification of Second Embodiment

Figure 18:
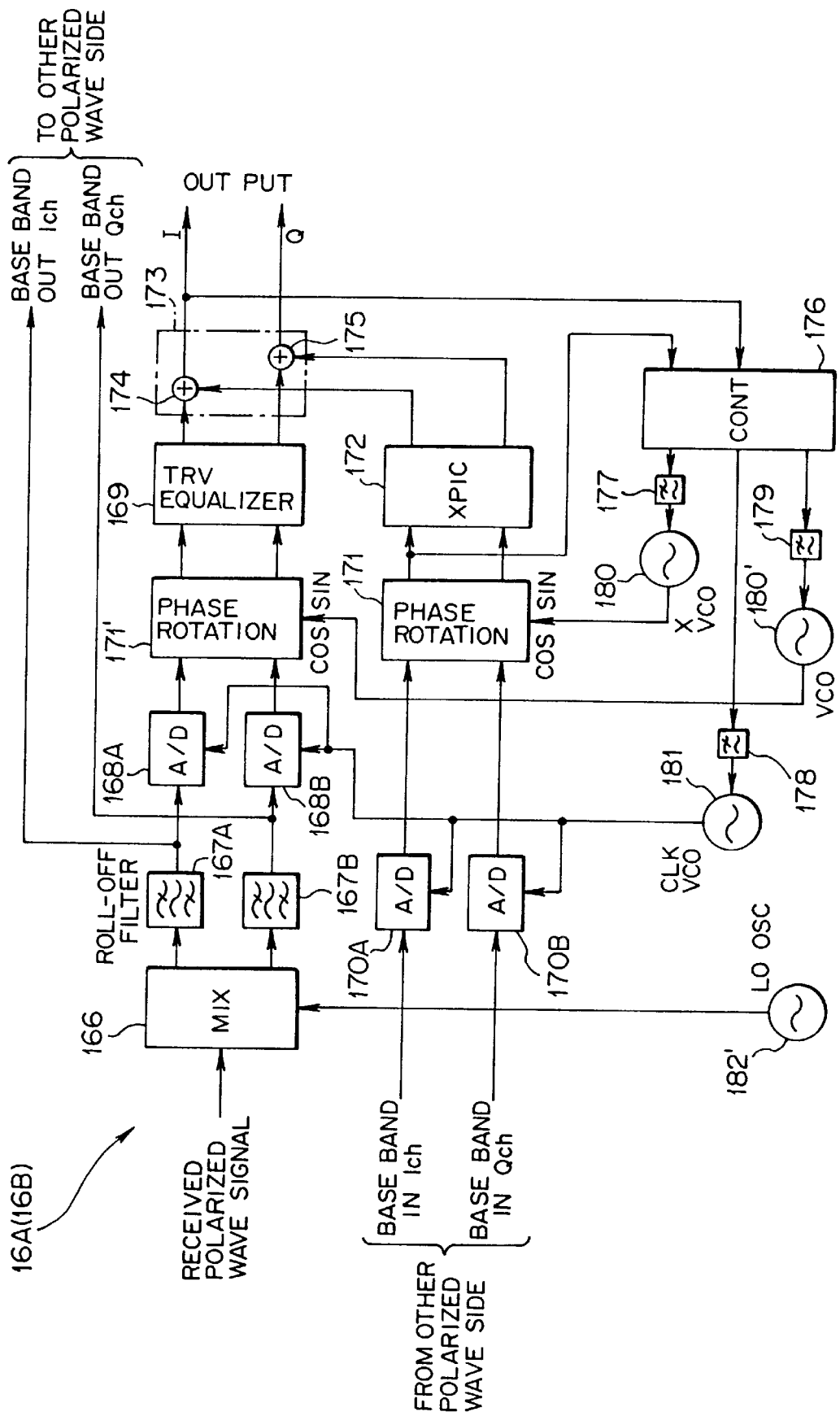
FIG. 18 is a block diagram showing a modification of the second embodiment.

FIG. 18 is a block diagram showing a modification of the second embodiment. The demodulating unit (inter-cross wave compensating apparatus) 16 shown in FIG. 18 is the same as that which has been described with reference to FIG. 10, except that the demodulating unit 16 of this modification further comprises a phase rotating unit 171', a voltage controlled oscillator (VCO) 180' for the phase rotating unit 171', and a voltage controlled local oscillator (LO OSC) 182'.

The phase rotating unit 171' has the same structure as that of the phase rotating unit 171 which has been described with reference to FIG. 11. The phase rotating unit 171' receives trigonometric signals ($\sin\theta$, $\cos\theta$) from the voltage controlled oscillator 180', and performs the operation represented by equations (15) and (16) for the outputs from the A/D converters 168A and 168B (first analog/digital converters) so as to perform frequency correction as in the phase rotating unit 171.

Figure 15:
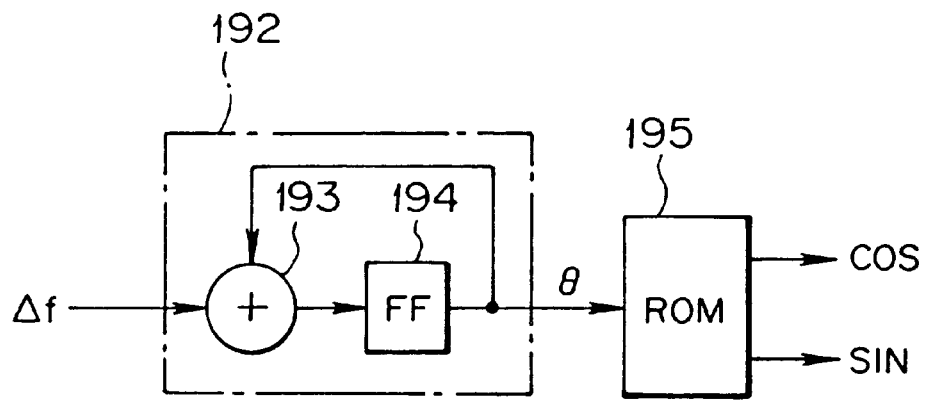
FIG. 15 is a block diagram showing the structure of a voltage controlled oscillator used in the second embodiment.

The voltage controlled oscillator 180' has the same structure as that of the voltage controlled oscillator 180 which has been described with reference to FIG. 15. The voltage controlled oscillator 180' generates the trigonometric signals in accordance with the phase error (phase shift information) $\Delta\theta$ which is obtained by the control unit (CONT) 176 and used for controlling the frequency correction at the phase rotating unit 171', and supplies the trigonometric signals to the phase rotating unit 171'.

Moreover, the local oscillator 182' generates a carrier wave regeneration signal used for down conversion and orthogonal detection in the mixer (orthogonal detection unit) 166 and supplies the carrier wave regeneration signal to the mixer 166. In the present modification, the carrier wave regeneration signal for the mixer 166 is separately generated and is supplied to the mixer 166 without using the feedback of information from the control unit 176.

In other words, the demodulating unit 16A of the present modification is provided with the phase rotating unit 171' for carrying out phase rotation for the output from the A/D converters 168A and 168B so as to perform frequency correction, whereby a quasi-homodyne detection unit is formed by the phase rotating unit 171 and the mixer 166.

In the present modification, the V wave signal and the H wave signal for interference compensation can be synchronized each other by performing phase rotation by the phase rotating units 171 and 171' for each of the V wave signal and the H wave signal for interference compensation.

Accordingly, inter-cross wave compensation can be extremely easily performed for V and H wave signals which are transmitted without synchronization during modulation for transmission at the transmitting side. This greatly contributes to decreasing the costs of inter-cross wave interference compensation.

In addition, since the V and H wave signals are not synchronized at the transmitting side, fine adjustment of frequencies for synchronization between the V wave signal and the H wave signal for interference compensation can be extremely easily performed.

The demodulating unit 16B for H waves has the same structure as that of the demodulating unit 16A for V waves, and the compensation of the interference component (V wave signal) of the H wave signal by the demodulating unit 16B for H waves is performed in the same manner as in the demodulating unit 16A for V waves.

(d) Third Embodiment of the Present Invention

Figure 19:
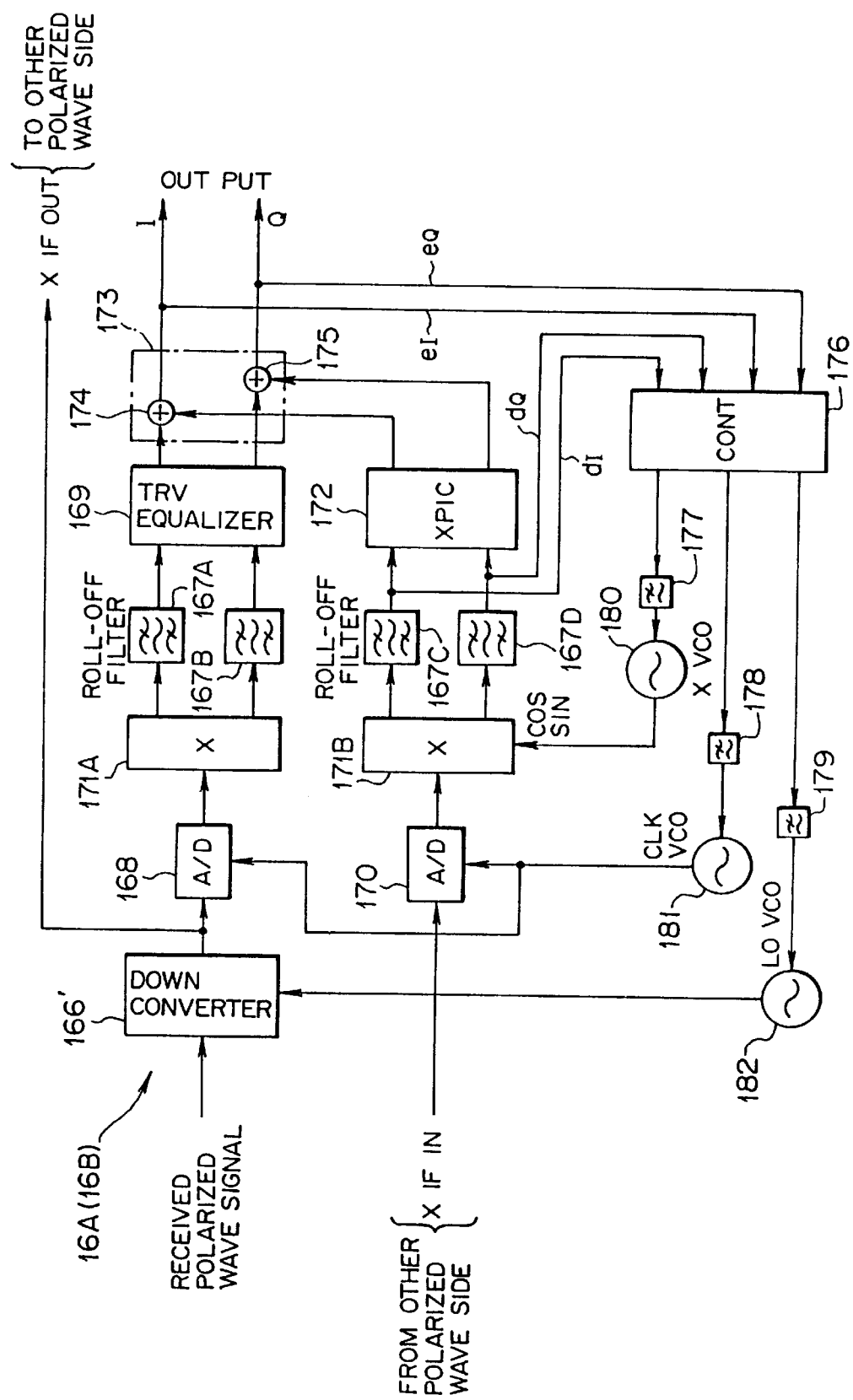
FIG. 19 is a block diagram showing a third embodiment of the present invention.

FIG. 19 is a block diagram showing a third embodiment of the present invention. The demodulating unit (inter-cross wave compensating apparatus) 16A shown in FIG. 19 is the same as that in the second embodiment which has been described with reference to FIG. 10, except that instead of analog demodulation method used in the second embodiment, a digital demodulation method is employed in the demodulating unit 16A.

That is, the demodulating unit 16A comprises a down converter 166', A/D converters 168 and 170, a digital orthogonal detection unit 171A, roll-off filters 167A–167D, a transversal equalizer 169, a digital phase rotating unit 171B, a digital inter-cross wave compensating unit (XPIC) 172, an adding unit 173, a control unit (CONT) 176, low pass filters 177–179, a voltage controlled oscillator (X VCO) 180 for the phase rotating unit 171B, a voltage controlled oscillator (CLK VCO) 181 for generating clocks for the A/D converters 168 and 170, and a voltage controlled local oscillator (LO VCO) 182 for generating a carrier wave regeneration signal for the down converter 166'.

The roll-off filters 167A–167D, the transversal equalizer 169, the digital inter-cross wave compensating unit 172, the adding unit 173, the control unit (CONT) 176, the low pass filters 177–179, the voltage controlled oscillators 180 and 181, and the local oscillator 182 are the same as those described in the second embodiment.

The down converter (frequency conversion unit) 166' performs down conversion for the V wave signal (one received polarized wave signal) between the two polarized wave signals (V and H wave signals) which are transmitted without establishing synchronization during modulation for transmission and which intersect each other, in accordance with a carrier wave regeneration signal supplied from the local oscillator 182 which receives information from the control unit 176. With this operation, the frequency of the V wave signal is decreased to a frequency (IF band) at which A/D conversion can be performed by the A/D converter 168.

That is, the present embodiment employs a homodyne detection method in which the down conversion by the down converter 166' is performed using feedback of an output obtained by detection by the digital orthogonal detection unit 171A.

In the present embodiment, the analog signal which is obtained by performing down conversion for the V wave signal by the down converter 166' is outputted to the demodulating unit 204B for H waves as a signal for inter-cross wave compensation which is used to compensate the V wave signal interfering with the H wave signal.

The A/D converter 168 converts the V wave signal, which has undergone the down conversion by the down converter 166', into a digital signal in accordance with timing clocks for A/D conversion supplied from the voltage controlled oscillator 181. The digital orthogonal detection unit 171A detects the V wave signal, which has been converted into a digital signal by the A/D converter 168, so as to obtain two digital orthogonal detection signals (digital demodulated signal) I and Q.

The A/D converter 170 converts an analog signal for inter-cross wave compensation, which is transmitted from the demodulating unit 204B for H waves and is obtained by down conversion of the H wave signal (the other received polarized wave signal), into a digital signal in accordance with timing clocks supplied from the voltage controlled oscillator 181, i.e., in the state in which the operational clocks for the A/D converter 170 are synchronized with the operational clocks for the AID converter 168.

In the present embodiment, an analog signal after down conversion of the H wave signal is used as a signal inputted to the digital phase rotating unit 171B. Accordingly, the A/D converter 170 is provided in a stage preceding the phase rotating unit 171B, and the operational clocks for the A/D converter 170 are synchronized with the operational clocks for the A/D converter 168 which converts the V wave signal undergone down conversion by the down converter 166' into a digital signal.

The phase rotating unit 171B receives the output of the A/D converter 170, i.e., a digital signal which is obtained through down conversion of the H wave signal, between the received V and H wave signals, performed by the demodulating unit 204B for H waves but which has not been detected by the digital orthogonal detection unit 171A for H waves. The phase rotating unit 171B then performs phase rotation for the digital signal so as to carry out frequency correction.

This phase rotating unit 171B has the same structure as that of the digital orthogonal detection unit 171A. However, as has been described in the second embodiment, the phase rotation is carried out in accordance with the trigonometric signals (sinθ, cosθ) which are supplied from the voltage controlled oscillator 180 in accordance with the deviation from the synchronized state between the V and H wave signals (phase error) Δθ which is obtained in the control unit 176, so that the phase error Δθ becomes "zero".

In the demodulating unit (inter-cross wave compensating apparatus) 16A having the above-described structure shown in FIG. 19, the V wave signal between the V and H waves signals which are transmitted without synchronization during modulation for transmission is converted (down conversion) into an IF signal by the down converter 166', and the analog signal after the down conversion is outputted to the demodulating unit 204B for H waves as a compensation signal for compensating the V wave signal interfering with the H wave signal. Also, the analog signal is converted into a digital signal by the A/D converter 168 at an optimal clock phase in accordance with timing clocks from the voltage controlled oscillator 181, which is controlled by information regarding the phase shift of clocks received from the control unit 176.

The process in the A/D converter 168 and the succeeding processes are all performed using digital signals. Orthogonal detection is performed for the digital signals in the digital orthogonal detection unit 171A so as to obtain two digital demodulated signals I and Q. After the noise components of these digital demodulated signals I and Q are removed by the roll-off filters 167A and 167B, an equalizing process for distortion is performed in the transversal equalizer.

The analog signal (analog H wave signal after down conversion in the demodulating unit 204B for H waves) transmitted from the demodulating unit 204B is converted into a digital signal by the A/D converter 170 using operational clocks synchronized with the A/D converter 168, and is outputted to the phase rotating unit 171B. The succeeding processes are all performed using digital signals.

At this time, the phase error Δθ for controlling the phase rotating unit 171B is obtained in the control unit 176 based on the information regarding the input of the digital inter-cross wave compensating unit 172 and the information regarding the output of the adding unit 173, and the phase error is supplied to the voltage controlled oscillator 180, so that the trigonometric signals supplied to the phase rotating unit 171B are controlled.

In the phase rotating unit 171B, orthogonal detection and phase rotation are performed for digital signals (H wave signal for interference compensation) from the A/D converter 170 in accordance with the trigonometric signals from the voltage controlled oscillator 180, so that two digital signals undergone frequency correction are obtained, and outputted to the digital inter-cross wave compensating unit 172.

In the digital inter-cross wave compensating unit 172, compensation signals $I_{XPIC}$ and $Q_{XPIC}$ used for compensating for an H wave signal contained as an interference component in the output of the transversal equalizer 169 is generated based on the digital signals (H wave signal) which have been synchronized with the V wave signal by performing frequency correction, and is outputted to the adding unit 173. In the adding unit 173, the compensation signals and the digital demodulated signals I and Q equalized by the transversal equalizer 169 are added together at the adders 174 and 175 so as to compensate for the interference component (H wave signal) of the V wave signal.

Accordingly, in the demodulating unit (inter-cross wave compensating apparatus) 16A according to the present embodiment, the process by the A/D converters 168 and 170 and the following processes can be performed in digital, including the inter-cross wave compensation by the digital inter-cross wave compensating unit 172. This makes it possible to perform compensation for inter-cross wave interference with considerably high accuracy.

In addition, the digital orthogonal detection unit 171A, the transversal equalizer 169, the digital inter-cross wave compensating unit 172, the phase rotating unit 171B, and the adding unit 173 can be formed as an LSI. This greatly contributes to decreasing the size and costs of the demodulating unit (inter-cross wave compensating apparatus) 16A.

Moreover, in the present embodiment, phase rotation is performed for the H wave signal for interference compensation by the phase rotating unit 171B so as to carry out frequency correction, thereby synchronizing the V wave signal and the H wave signal for interference compensation. Accordingly, inter-cross wave compensation can be extremely easily performed for V and H wave signals which are transmitted without synchronization during modulation for transmission at the transmitting side. This greatly contributes to decreasing the costs of inter-cross wave interference compensation In addition, since the H and V wave signals are not synchronized at the transmitting side, fine adjustment of frequencies for synchronization between the V wave signal and the H wave signal for interference compensation can be extremely easily performed.

The demodulating unit 163 for H waves has the same structure as that of the demodulating unit 16A for V waves shown in FIG. 19, and compensation for the interference component (V wave signal) of the H wave signal by the demodulating unit 16B for H waves is performed in the same manner as in the demodulating unit 16A for V waves.

(d-1) First Modification of Third Embodiment

Figure 20:
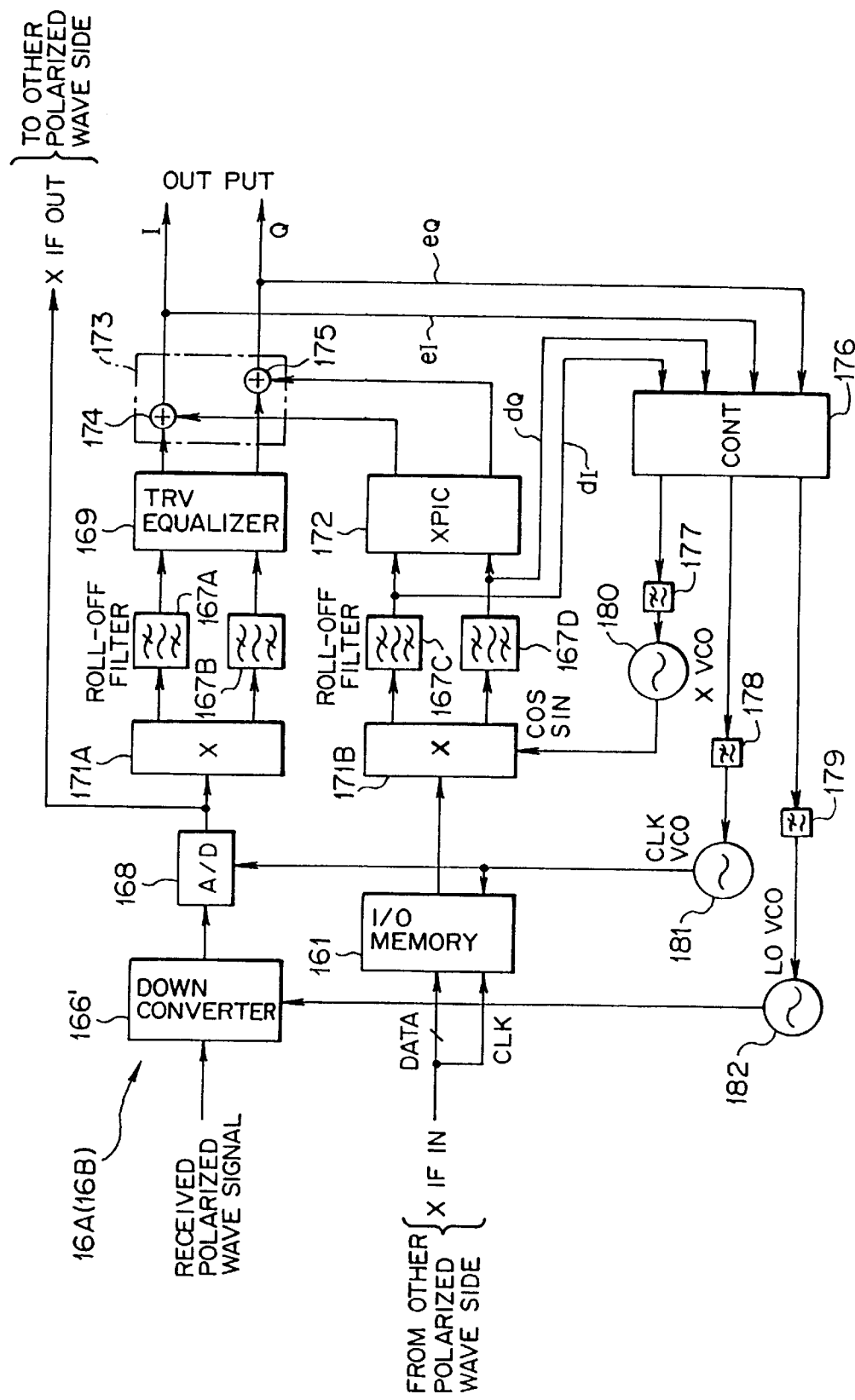
FIG. 20 is a block diagram showing a first modification of the third embodiment.

FIG. 20 is a block diagram showing a first modification of the third embodiment of the present invention. In the demodulating unit 16A shown in FIG. 20, the digital signal (X IF) which is obtained by converting (down conversion) the H wave signal into an IF signal and is then converted into a digital signal by the A/D converter 168 is used as the signal inputted to the phase rotating unit 171B, as in the demodulating unit which has been described in the first embodiment with reference to FIG. 7. Therefore, an I/O memory 161 is provided in a stage preceding the phase rotating unit 171B so as to eliminate uncertainty of clock phase between the two polarized wave signals (V and H wave signals). The other structural elements are identical to those which have been described with reference to FIG. 19, and the I/O memory 161 is identical to that shown in FIG. 8.

In the demodulating unit 16A for V waves, due to the above-described structure, data of the H wave signal which are converted into a digital signal by A/D conversion in accordance the timing clocks from the voltage controlled oscillator 181 in the demodulating unit 16B for H waves and are transmitted to the demodulating unit 16A are read out from the I/O memory 161 in accordance with the timing clocks from the own voltage controlled oscillator 181 (of the demodulating unit 16A for V waves). With this operation, uncertainty of the clock phase between the V wave signal and the H wave signal for interference compensation can be eliminated.

Accordingly, in the present modification, the exchange of the V and H wave signals between the demodulating units 16A and 16B can be stably and reliably performed in digital even when the wave signals include jitter and the like.

(d-2) Second Modification of Third Embodiment

Figure 21:
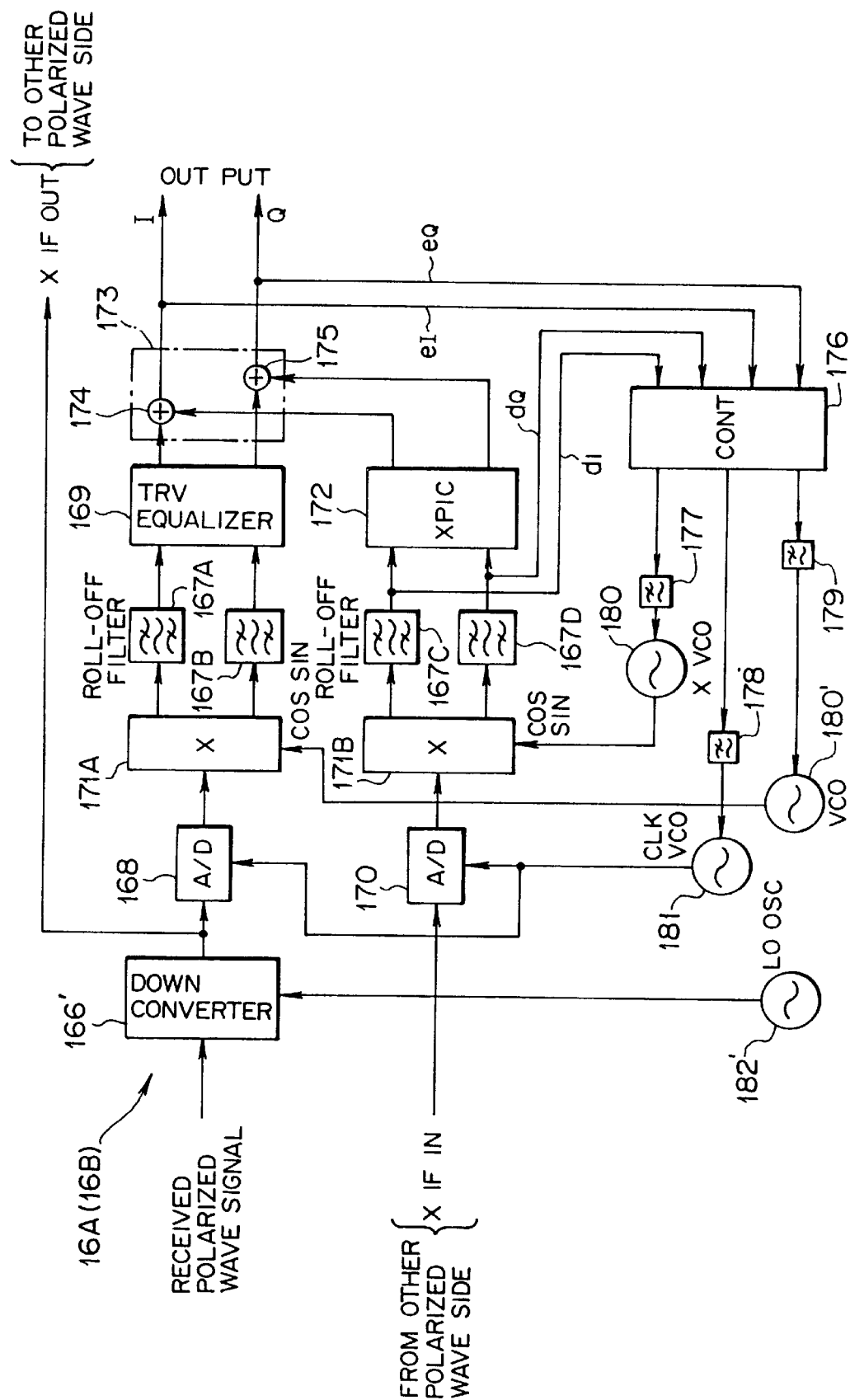
FIG. 21 is a block diagram showing a second modification of the third embodiment.

FIG. 21 is a block diagram showing a second modification of the third embodiment of the present invention. In the demodulating unit 16A shown in FIG. 21, the down conversion by the down converter 166' employs a quasi-homodyne detection method which does not use feedback of the output obtained through the detection by the digital orthogonal detection unit 171A.

Therefore, in the present modification, a voltage controlled local oscillator 182' for the down converter 166' is separately provided, and a voltage controlled oscillator 180' for the digital orthogonal detection unit 171A is provided, as in the demodulating unit which has been described with reference to FIG. 18.

Accordingly, in the present modification, phase rotation is performed by the digital orthogonal detection unit 171A and the phase rotating unit 171B for each of the V wave signal and the H wave signal for interference compensation so as to carry out frequency correction, thereby synchronizing the V wave signal and the H wave signal for interference compensation. Accordingly, inter-cross wave compensation can be extremely easily performed for the V and H wave signals which are transmitted without synchronization during modulation for transmission at the transmitting side. This greatly contributes to decreasing the costs of inter-cross wave interference compensation.

In addition, since the H and V wave signals are not synchronized at the transmitting side, fine adjustment of frequencies for synchronization between the V wave signal and the H wave signal for interference compensation can be extremely easily performed.

The demodulating unit 16B for H waves has the same structure as that of the demodulating unit 16A for V waves shown in FIG. 21, and compensation for the interference component (V wave signal) of the H wave signal by the demodulating unit 16B for H waves is performed in the same manner as in the demodulating unit 16A for V waves.

(d-3) Third Modification of Third Embodiment

Figure 22:
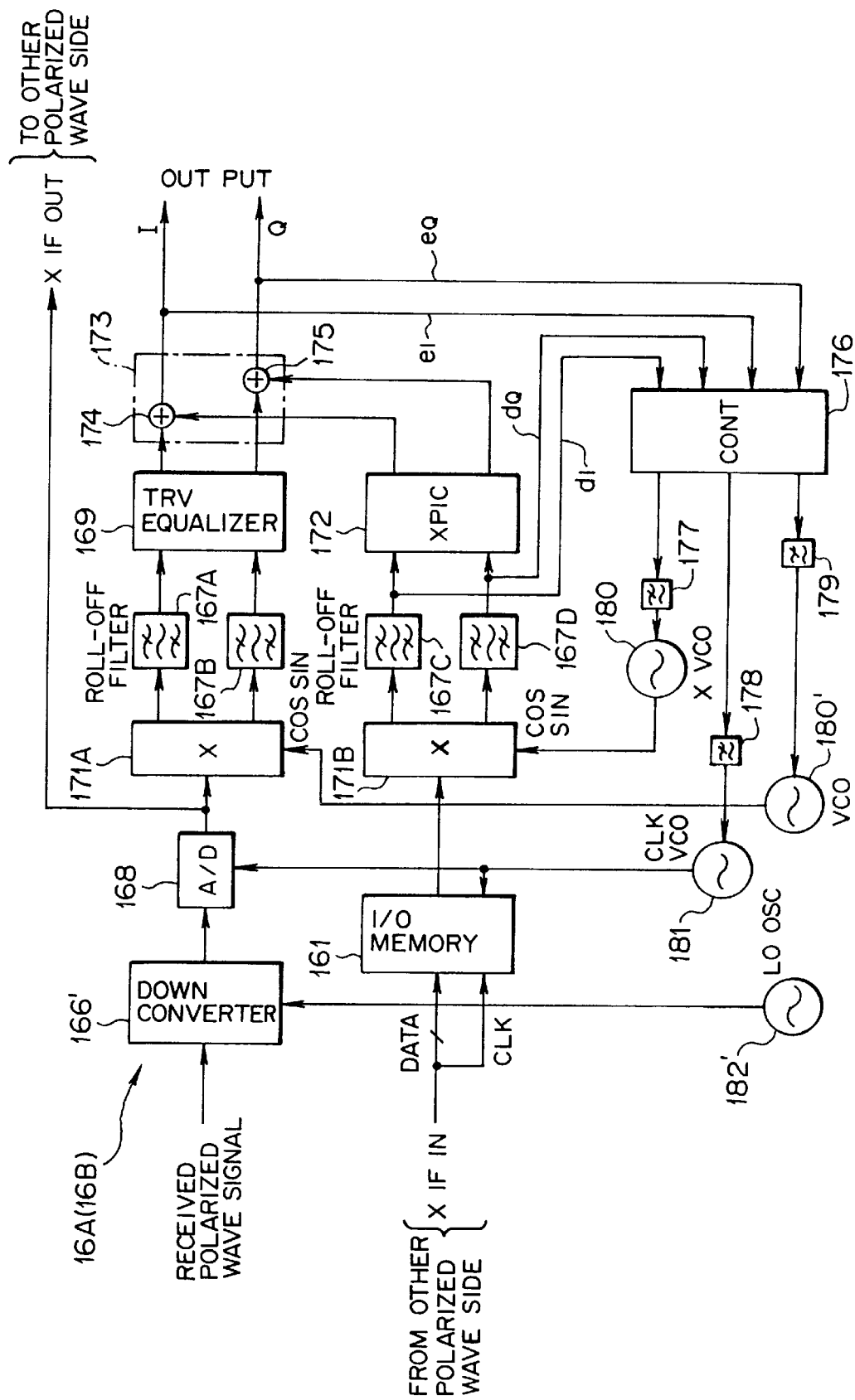
FIG. 22 is a block diagram showing a third modification of the third embodiment.
Figure 23:
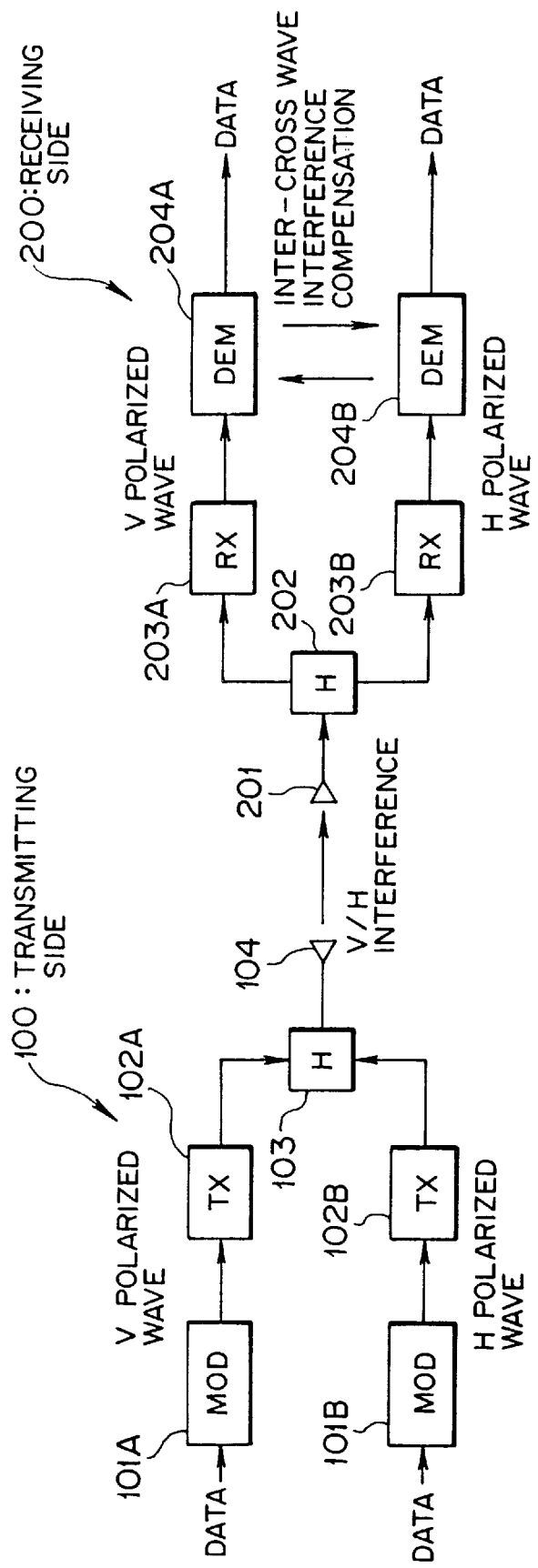
FIG. 23 is a block diagram showing an example of the structures of the transmitting side and the receiving side of a radio transmitting system using general cross-polarized waves.
Figure 24:
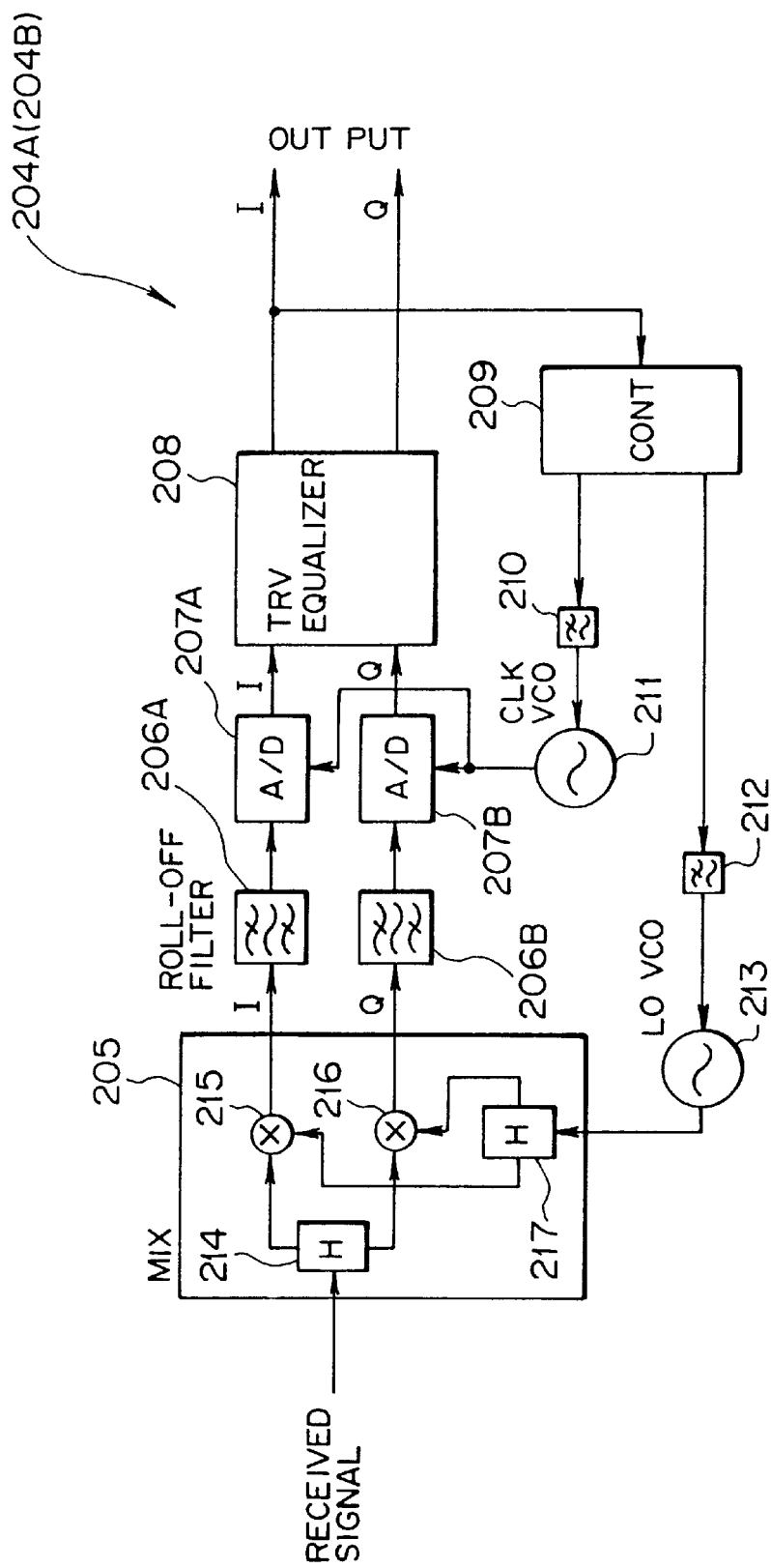
FIG. 24 is a block diagram showing an example of the structure of a demodulating unit using a general analog demodulating method.
Figure 25:
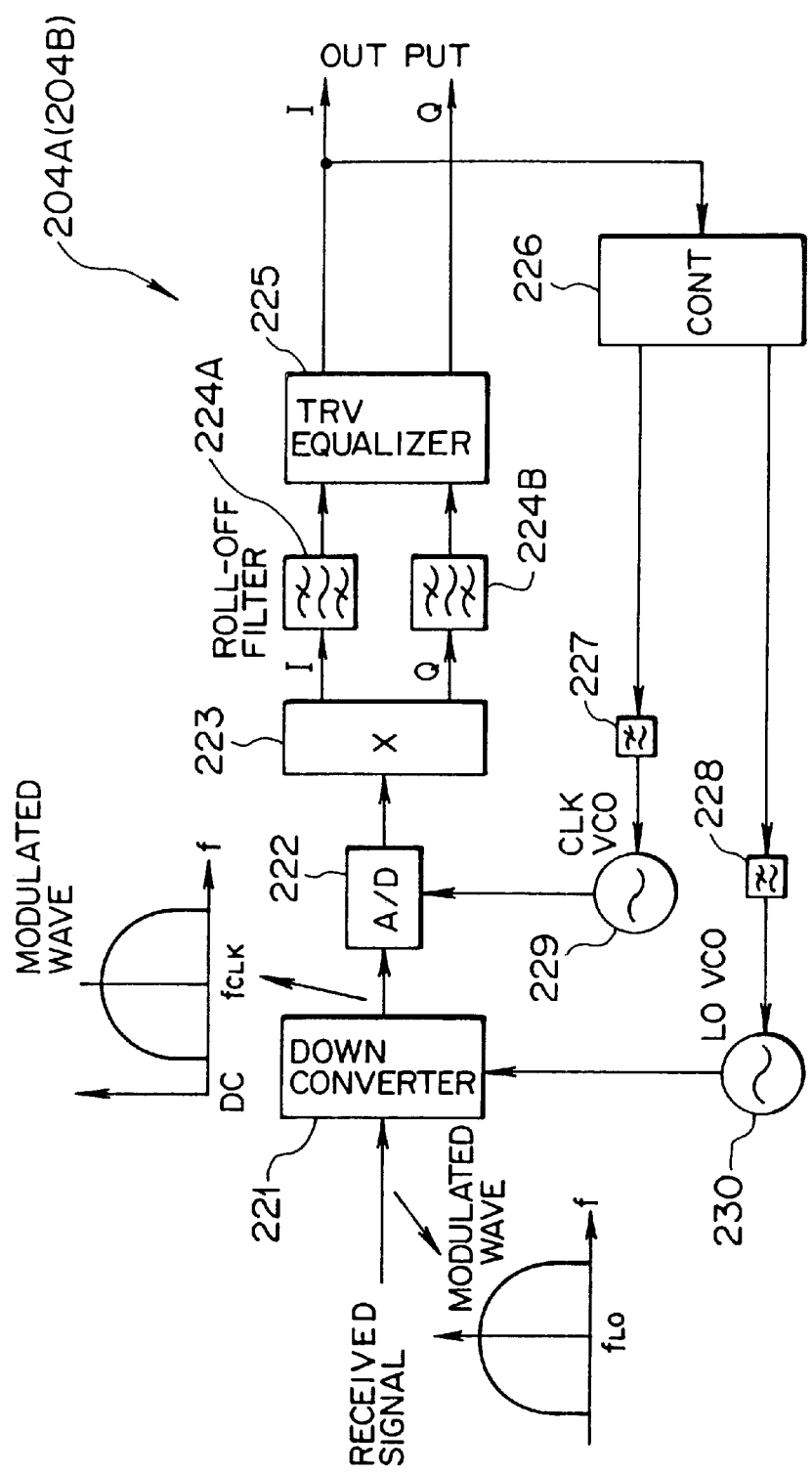
FIG. 25 is a block diagram showing an example of the structure of a demodulating unit using a general digital demodulating method.

FIG. 22 is a block diagram showing a third modification of the third embodiment of the present invention. The demodulating unit 16A shown in FIG. 22 is obtained by adding an I/O memory 161 shown in FIG. 20 to the demodulating unit 16A shown in FIG. 21 in which a quasi-homodyne detection method is employed.

In the present modification, a digital signal which is obtained by down conversion of the H wave signal (V wave signal) and is converted into a digital signal by the A/D converter 168 is used as the signal inputted to the phase rotating unit 171B. Therefore, the I/O memory 161 is provided in a stage preceding the phase rotating unit 171B so as to eliminate uncertainty of clock phase between the two polarized wave signals (V and H wave signals).

In the demodulating unit 16A for V waves, data of the H wave signal which are converted into a digital signal by A/D conversion in accordance the timing clocks from the voltage controlled oscillator 181 in the demodulating unit 16B for H waves and are transmitted to the demodulating unit 16A are read out from the I/O memory 161 in accordance with the timing clocks from the own voltage controlled oscillator 181 (of the demodulating unit 16A for V waves). With this operation, uncertainty of the clock phase between the V wave signal and the H wave signal for interference compensation can be eliminated.

Accordingly, in addition to the benefit or effect described in the first modification it is possible to provide additional benefit or effect that the exchange of the V and X wave signals between the demodulating units 16A and 16B can be stably and reliably performed using digital signals even when the wave signals include jitter and the like.

What is claimed is:

1. A method for inter-cross wave compensation, comprising the steps of:

performing frequency conversion for one of two received polarized wave signals intersecting each other, converting the one of two signals into a digital signal by an analog/digital converter, and detecting the digital signal by a digital demodulating unit; and supplying a digital inter-cross wave compensating unit with a signal previously obtained by performing frequency conversion for the other of the two received polarized wave signals intersecting each other but not detected by said digital demodulating unit, and compensating the output of said digital demodulating unit for the one of the polarized wave signals in accordance with the output of said inter-cross wave compensating unit.

2. The method for inter-cross wave compensation according to claim 1, wherein the signal previously obtained by performing frequency conversion of the other of the two received polarized wave signals supplied to said inter-cross wave compensating unit is an analog signal.

3. The method for inter-cross wave compensation according to claim 1, wherein a digital signal which is obtained through frequency conversion of the other of polarized wave signals and is converted into a digital signal by the analog/digital converter is used as a signal inputted to said inter-cross wave compensating unit.

4. An apparatus for inter-cross wave compensation, comprising:

a frequency conversion unit for performing frequency conversion for one of two received polarized wave signals intersecting each other;

an analog/digital converter for converting the one of the polarized wave signals, which has undergone frequency conversion by said frequency conversion unit, into a digital signal;

a digital orthogonal detection unit for detecting the one of the polarized wave signals, which has been converted into a digital signal by said analog/digital converter, to obtain two orthogonal detection signals;

a digital equalizing unit for performing an equalizing process for the outputs of said orthogonal detection unit;

a digital inter-cross wave compensating unit for receiving, as a digital signal, a signal which is previously obtained through frequency conversion for the other of the two received polarized wave signals intersecting each other but which has not been detected by said digital orthogonal detection unit, and for outputting a signal used for compensating the output of said digital equalizing unit; and an adding unit for adding the output of said digital equalizing unit and the output of said digital inter-cross wave compensating unit together.

5. The apparatus for inter-cross wave compensation according to claim 4, wherein in the case where an analog signal after frequency conversion of the other of the polarized wave signals is used as a signal inputted to said inter-cross wave compensating unit, an analog/digital converter is provided in a stage preceding said digital inter-cross wave compensating unit, operational clocks for the analog/digital converter being synchronized with operational clocks for the analog/digital converter for converting the one of the polarized wave signals undergone frequency conversion by said frequency conversion unit into a digital signal.

6. The apparatus for inter-cross wave compensation according to claim 4, wherein in the case where a digital signal which is obtained through frequency conversion of the other of polarized wave signals and is converted into a digital signal by an analog/digital converter is used as a signal input to said inter-cross wave compensating unit, a memory is provided in a stage preceding said digital inter-cross wave compensating unit so as to eliminate uncertainty of the clock phase between the two polarized wave signals.

7. The apparatus for inter-cross wave compensation according to claim 4, wherein said digital orthogonal detection unit, said digital equalizing unit, said digital inter-cross wave compensating unit, and said adding unit are formed in an LSI.

8. A method for inter-cross wave compensation, comprising the steps of:

performing frequency conversion and detection for one of a vertical polarized wave signal and a horizontal polarized wave signal which are transmitted without synchronization during modulation for transmission and which intersect each other; and performing phase rotation for a signal obtained by frequency conversion of the other of the vertical polarized wave signal and the horizontal polarized wave signal intersecting each other, thereby performing frequency correction, supplying the compensated signal to an inter-cross wave compensating unit, and compensating the output of the digital demodulating unit for the one of the vertical polarized wave signal and the horizontal polarized wave signal in accordance with the output of said inter-cross wave compensating unit.

9. An apparatus for inter-cross wave compensation, comprising:

an analog orthogonal detection unit for performing frequency conversion for one of two received polarized wave signals which are transmitted without synchronization during modulation for transmission and which intersect each other, and for detecting the one of the received polarized wave signals so as to obtain two orthogonal detection signals;

a first analog/digital converter for converting the two orthogonal detection signals obtained by said orthogonal detection unit into digital signals;

a digital equalizing unit for performing an equalizing process for the two orthogonal detection signals which have been converted into digital signals by said first analog/digital converter;

a second analog/digital converter for performing conversion into digital signals for signals which are obtained by detecting, as the two orthogonal detection signals, the other of the two received wave signals intersecting each other by the analog orthogonal detection unit but which have not been converted into digital signals by said first analog/digital converter, operational clocks of said second analog/digital converter being synchronized with those for said first analog/digital converter;

a phase rotating unit for performing phase rotation for output from said second analog/digital converter so as to perform frequency correction;

a digital inter-cross wave compensating unit for receiving the output of said phase rotating unit and for outputting a signal used for compensating the output of said digital equalizing unit;

an adding unit for adding the output of said digital equalizing unit and the output of said digital inter-cross wave compensating unit together; and a control unit for controlling said phase rotating unit based on information regarding the input of said digital inter-cross wave compensating unit and information regarding the output of said adding unit.

10. The apparatus for inter-cross wave compensation according to claim 9, wherein said orthogonal detection unit is a homodyne detection unit.

11. The apparatus for inter-cross wave compensation according to claim 9, wherein a phase rotating unit is provided so as to perform phase rotation for the output from said first analog/digital converter, thereby performing frequency correction, and said phase rotating unit and said orthogonal detection unit constitute a quasi-homodyne detection unit.

12. The apparatus for inter-cross wave compensation according to claim 9, wherein said control unit has a structure such that phase shift information for controlling said phase rotating unit is obtained based on information regarding the polarity of the input of said digital inter-cross wave compensating unit and information regarding an error in the output of said adding unit, and the phase shift information is outputted as a phase rotating unit control signal.

13. The apparatus for inter-cross wave compensation according to claim 9, wherein said control unit has a structure such that phase shift information for controlling said phase rotating unit is obtained based on information of the result of an exclusive OR operation between the polarity information of the input of said digital inter-cross wave compensating unit and the polarity information of an error in the output of said adding unit, and the phase shift information is outputted as a phase rotating unit control signal.

14. An apparatus for inter-cross wave compensation, comprising:

a frequency conversion unit for performing frequency conversion for one of two received polarized wave signals which are transmitted without synchronization during modulation for transmission and which intersect each other;

an analog/digital converter for converting the one of the polarized wave signals, which has undergone frequency conversion by said frequency conversion unit, into a digital signal;

a digital orthogonal detection unit for detecting the one of the polarized wave signals, which has been converted into a digital signal by said analog/digital converter, to obtain two orthogonal detection signals;

a digital equalizing unit for performing an equalizing process for the outputs of said orthogonal detection unit;

a phase rotating unit for receiving, as a digital signal, a signal which is obtained through frequency conversion for the other of the two received polarized wave signals intersecting each other but which has not been detected by said digital orthogonal detection, and for performing phase rotation for the digital signal so as to perform frequency correction;

a digital inter-cross wave compensating unit for receiving an output from said phase rotating unit and for outputting a signal for compensating the output of said digital equalizing unit;

an adding unit for adding the output of said digital equalizing unit and the output of said digital inter-cross wave compensating unit together; and a control unit for controlling said phase rotating unit based on information regarding the input of said digital inter-cross wave compensating unit and information regarding the output of said adding unit.

15. The apparatus for inter-cross wave compensation according to claim 14, wherein in the case where an analog signal after frequency conversion of the other of polarized wave signals is used as a signal inputted to said phase rotating unit, an analog/digital converter is provided in a stage preceding said phase rotating unit, operational clocks for the analog/digital converter being synchronized with operational clocks for the analog/digital converter for converting the one of the polarized wave signals undergone frequency conversion by said frequency conversion unit into a digital signal.

16. The apparatus for inter-cross wave compensation according to claim 14, wherein in the case where a digital signal which is obtained through frequency conversion of the other of the two received polarized wave signals and is converted into a digital signal by an analog/digital converter is used as a signal inputted to said phase rotating unit, a memory is provided in a stage preceding said phase rotating unit so as to eliminate uncertainty of the clock phase between the two received polarized wave signals.

17. The apparatus for inter-cross wave compensation according to claim 14, wherein said digital orthogonal detection unit, said digital equalizing unit, said phase rotating unit, said digital inter-cross wave compensating unit, and said adding unit are formed in an LSI.

18. The apparatus for inter-cross wave compensation according to claim 14, wherein a homodyne detection method is employed in which frequency conversion by said frequency conversion unit is performed using feedback of an output obtained through detection.

19. The apparatus for inter-cross wave compensation according to claim 14, wherein a quasi-homodyne detection method is employed in which frequency conversion by said frequency conversion unit is performed without using feedback of an output obtained through detection.

20. The apparatus for inter-cross wave compensation according to claim 14, wherein said control unit has a structure such that phase shift information for controlling said phase rotating unit is obtained based on information regarding the polarity of the input of said digital inter-cross wave compensating unit and information regarding an error in the output of said adding unit, and the phase shift information is outputted as a phase rotating unit control signal.

21. The apparatus for inter-cross wave compensation according to claim 14, wherein said control unit has a structure such that phase shift information for controlling said phase rotating unit is obtained based on information regarding the result of an exclusive OR operation between the polarity information of the input of said digital inter-cross wave compensating unit and the polarity information of an error in the output of said adding unit, and the phase shift information is outputted as a phase rotating unit control signal.

* * * * *